United States Patent [19]

Hasunuma et al.

[11] Patent Number: 5,498,909
[45] Date of Patent: Mar. 12, 1996

[54] SEMICONDUCTOR DEVICE AND METHOD OF MANUFACTURING SUCH SEMICONDUCTOR DEVICE

[75] Inventors: Masahiko Hasunuma, Yokohama; Hisashi Kaneko, Fujisawa; Atsuhito Sawabe, Yokosuka; Takashi Kawanoue, Yokohama; Yoshiko Kohanawa, Yokohama; Shuichi Komatsu, Yokohama, all of Japan

[73] Assignee: Kabushiki Kaisha Toshiba, Kawasaki, Japan

[21] Appl. No.: 937,398

[22] Filed: Aug. 31, 1992

Related U.S. Application Data

[63] Continuation of Ser. No. 545,870, Jun. 29, 1990.

[30] Foreign Application Priority Data

| Jul. 1, 1989 | [JP] | Japan | 1-168308 |
| Sep. 26, 1989 | [JP] | Japan | 1-247938 |
| Sep. 26, 1989 | [JP] | Japan | 1-247941 |
| Sep. 26, 1989 | [JP] | Japan | 1-247944 |
| Sep. 26, 1989 | [JP] | Japan | 1-247946 |
| Sep. 27, 1989 | [JP] | Japan | 1-251355 |
| Sep. 27, 1989 | [JP] | Japan | 1-251356 |
| Sep. 27, 1989 | [JP] | Japan | 1-251357 |
| Sep. 27, 1989 | [JP] | Japan | 1-251358 |
| Sep. 27, 1989 | [JP] | Japan | 1-251360 |
| Sep. 27, 1989 | [JP] | Japan | 1-251361 |

[51] Int. Cl.$^6$ .......... H01L 23/48; H01L 23/52; H01L 29/40; H01L 23/28
[52] U.S. Cl. .......... 257/754; 257/762; 257/765; 257/771
[58] Field of Search .......... 257/740, 741, 257/765, 771, 754, 762

[56] References Cited

U.S. PATENT DOCUMENTS

| 3,725,309 | 4/1973 | Ames et al. | 257/762 |
| 4,438,450 | 3/1984 | Sheng et al. | 257/771 |
| 4,910,580 | 3/1990 | Kuecher et al. | 257/765 |
| 4,980,752 | 12/1990 | Jones, Jr. | 257/765 |

FOREIGN PATENT DOCUMENTS

| 60-95949 | 5/1985 | Japan | 257/771 |
| 61-99372 | 5/1986 | Japan . | |
| 6437051 | 2/1987 | Japan . | |

OTHER PUBLICATIONS

Harada et al, "Ohmic Contact in ECRCVD–TiN/Si Structure", 1993 International Conf. on Solid State Devices and Mat., Makuhari, 1993, pp. 174–176.

Nikkei Microdevices, May 1990, pp. 93–104.

A Newly Developed Mode For Stress Induced Slit–Like Voiding; H. Kaneko, et al. pp. 194–199. (1990).

Technical Digest of IEDM '89, "Single Crystal Aluminum Lines With Excellent Endurance Against Stress Induced Failure"; M. Hasunuma et al; Dec. 3, 1989.

Thin Solid Films, 75(1981) 253–259, "Effect of Texture and Grain Structure on Electromigration in Al–0.5%Cu Thin Films"; S. Vaidya et al; 1981.

Primary Examiner—Sara W. Crane
Assistant Examiner—S. V. Clark
Attorney, Agent, or Firm—Oblon, Spivak, McClelland, Maier & Neustadt

[57] ABSTRACT

The close-packed plane of a single crystal forming an electrode line such as electrodes or lines of a semiconductor device whose active regions are reduced in size, i.e., highly integrated, is arranged parallel to the longitudinal direction of the line; or in the case of a polycrystalline electrode line, the angle formed between the normal line direction of the close-packed plane of its crystal grains and that of the electrode line is arranged to be 80° or less.

13 Claims, 25 Drawing Sheets

FIG. 18
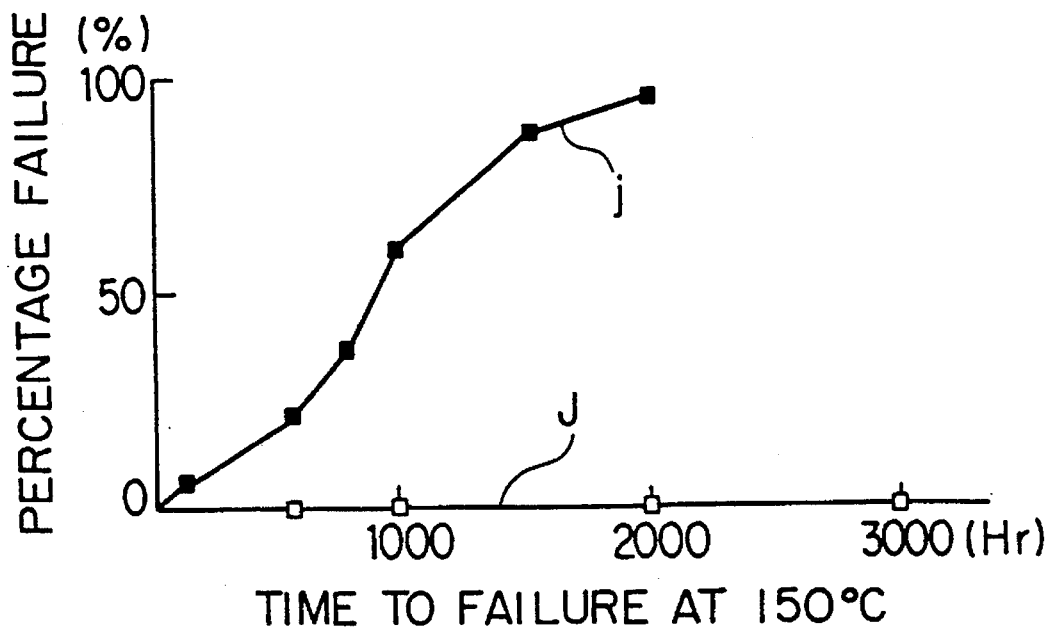
FIG. 19(a)    FIG. 19(b)
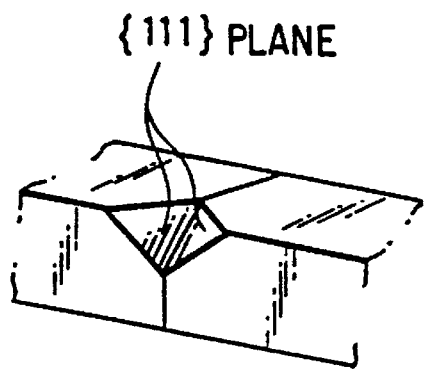
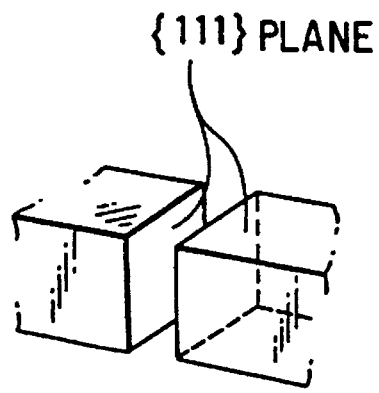

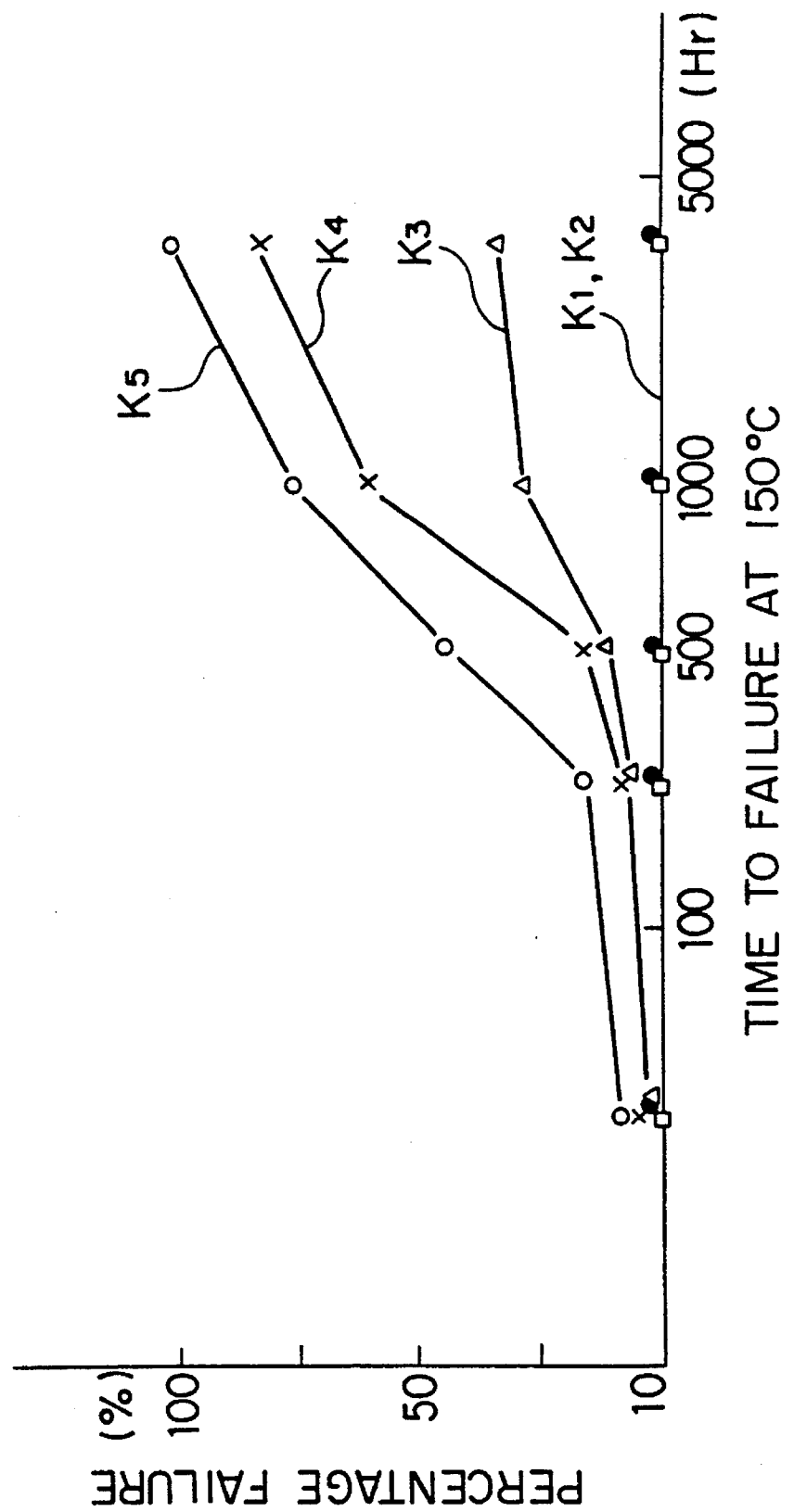

SEMICONDUCTOR DEVICE AND METHOD OF MANUFACTURING SUCH SEMICONDUCTOR DEVICE

This is a continuation of application Ser. No. 07/545,870, filed on Jun. 29, 1990.

BACKGROUND OF THE INVENTION

1. Field of the Invention

This invention relates to a semiconductor device and a method of manufacturing such semiconductor device, and more particularly to an integrated circuit (IC) device with an improved endurance against stress induced failure and a method of manufacturing such IC device.

2. Description of the Related Art

With a remarkable development in miniaturization and increased degree of integration of semiconductor devices such as memory IC devices represented by D-RAMs (dynamic random access memory), the size of active regions (functional regions) and interconnections for such active regions is made increasingly smaller. That are, as the number of active regions on a semiconductor chip of certain size increases (i.e., reduction in size of the active regions), the size of the interconnections for connecting these active regions must necessarily be reduced or multilayered.

As the interconnections are formed in smaller size, their characteristic requirements become all the more stringent. That is, in addition to the problems of reduced electric resistance causing voltage drops, electromigration resistance due to the application of high current densities, ohmic contact and contact at respective active regions or shrunk portions of interconnections, adhere to insulating films (insulating layers) endurance against stress induced failure must also be taken care of.

Stress induced failure is attributable to thermal expansion coefficient mismatch between a polycrystalline metal or single crystal metal forming the electrode line and a passivation film for covering such polycrystalline metal or single crystal metal. Stress induced failure is a phenomenon that the electrode line fails during use of a semiconductor device due to a thermal stress caused when the passivation film is heated to high temperatures for its formation and then cooled down to room temperature.

That is, stress induced failure is a line void caused in the course of relieving the thermal stress due to thermal expansion coefficient mismatch between the electrode line and the passivation film. It occurs at grain boundaries, and it has been found out that the ruptured (cut) surface is a (111) plane in the case of an Al-Si line.

Further, in the case of a multilayered line, a hole (via hole) is arranged in an insulating layer interposed between different line layers and this via hole is filled by a conductive material by, e.g., a bias sputtering, a chemical vapor deposition (CVD) method, a CVD-W method, or a CVD-Al method to achieve inter-line connections. However, as the line width becomes narrower, so does the diameter of the via hole, and this causes high density current to flow in the interconnections, thereby imposing the problem of impaired electromigration resistance.

In view of the electromigration resistance that must be improved as the electrode line is increasingly smaller, attempts to arrange (form) the electrode line with a single crystal metal are disclosed, e.g., in Japanese Patent Unexamined Publication No. 37050/1989. However, the electrode line made of a single crystal metal is not sufficiently reliable in terms of impurity elements from the passivation film with which the surface of the electrode line is covered, diffusion of a gas, and moisture resistance and endurance against stress induced failure of the electrode line.

As a measure to improving the endurance against stress induced failure of the polycrystalline electrode line, attempts have been made to suppress thermal stresses by forming the passivation film at low temperatures and to reinforce its grain boundaries where voids occur by using an alloy represented by an Al-Si-Cu alloy line thereby to precipitate an intermetallic compound at these grain boundaries. However, they have not been satisfactory yet.

There are other electrode line arrangements. For example, Japanese Patent Unexamined Publication Nos. 308348/1989 and 47951/1988 disclose an arrangement that a polycrystalline metal electrode line is coated with a high melting point metal or a silicide or a nitride of the high melting point metal. However, in such an arrangement, the coated high melting point metal element diffuses through the grain boundaries of the polycrystalline metal, thereby increasing the resistivity of the electrode line or impairing its electromigration resistance and endurance against stress induced failure due to precipitations at the grain boundaries. As a result, the electrode line becomes susceptible to lose its reliability. For example, in the case of an electrode line having W coated on a line composed of an Al-2 wt % Si alloy, no line failure of the coated W film was observed while apparent line failures of the Al-Si line inside were detected during stress induced failure tests, whereby it has been verified that the electrode line was not sufficiently reliable.

With respect to improvement in electromigration resistance, attention has been given to the crystal orientation of a thin film constituting the electrode line. And, the relationship between the electromigration resistance and the integrated intensity ratio ($f_{(111)}/f_{(200)}$) of the (111) plane to the (200) plane obtained by an X-ray measurement indicates that the larger the ratio is, the better the electromigration resistance is (S. Vaidya et al., "Thin Solid Film", 75 (1981), pages 253ff). However, this publication does not refer to the extent of (111) orientation itself nor does it discuss endurance against stress induced failure at all.

As described above, to further reduce the size of the elements and increase the degree of integration of the conventional semiconductor devices, it is desired that the problems not only of providing the electrode line with sufficient electromigration resistance and endurance against stress induced failure but also of providing sufficient safeguards to the impaired electromigration resistance and endurance against stress induced failure due to diffusion of impurities and water from the coated passivation film be well taken care of.

Further, the electrode line must be highly formable, highly resistant to various thermal and chemical treatments during manufacturing processes, and easy to be manufactured or formed thereby to allow highly reliable semiconductor devices to be obtained consistently.

With respect to means for deposition of a single crystal film, a method such as an ion beam sputtering method, a thermal CVD method, or an ion cluster beam deposition method is generally employed to directly deposit a metal film on a (111) Si substrate, and this metal film is subjected to, e.g., a photoetching process to pattern into a line. However, since it is difficult to deposit a predetermined single crystal film on to an interlayer insulating film such as SiO₂ and the relationship between the crystal orientation and the single crystal line direction is neglected in the actual process, the means for depositing the single crystal electrode line is likewise afflicted by the problem of impaired electromigration resistance and endurance against stress induced failure.

An object of the present invention is therefore to provide a semiconductor device having an electrode line whose electromigration resistance and endurance against stress induced failure are improved.

Another object of the present invention is to provide a semiconductor device allowing the reduction in size of an active region; i.e., high density arrangement.

Still another object of the present invention is to provide a semiconductor device which is highly reliable functionally.

Still another object of the present invention is to provide a method of easily manufacturing a semiconductor device which allows the reduction in size of an active region; i.e., high density arrangement.

Still another object of the present invention is to provide a method of easily manufacturing a semiconductor device which is highly reliable functionally.

SUMMARY OF THE INVENTIONS

The gist of the present invention is that the close-packed plane of a single crystal forming an electrode line such as electrodes or lines of a semiconductor device whose active regions are reduced in size, i.e., highly integrated, is arranged parallel to the longitudinal direction of the line; or in the case of a polycrystalline electrode line, the angle formed between the normal line direction of the close-packed plane of its crystal grains and that of the bottom surface of the line (surface which is in contact with the active region side through an insulating layer) of the electrode line is arranged to be 80° or less.

In the semiconductor device according to the present invention, the arrangement in which the close-packed plane of the crystal constituting the electrode line for the electrodes or lines is parallel to the longitudinal direction of the line requires that the electrode line be arranged parallel to the (111) plane that is the close-packed plane in the case of the fcc structure; to the (110) plane in the case of the bcc structure; and to the (0001) plane in the case of the hcp structure.

Further, in the semiconductor device according to the present invention, a polycrystalline electrode line is arranged so that the normal line direction of each of the close-packed planes forms 80° or less with the normal line direction of the bottom surface of the line (surface which is in contact with the active region through an insulating layer). In this case, it is required that 95% or more of the respective grains constituting the polycrystalline electrode line satisfy the above-described angle requirement.

BRIEF DESCRIPTION OF THE DRAWINGS

FIGS. 2, 4, 6, 8, 10, 11, 15, 16, 17, 18, 20, 22, 23, and 36 are characteristic diagrams each comparing the reliability evaluated on a semiconductor device according to the present invention and that of a comparative example;

FIG. 19 (a) and (b) are sectional views each schematically showing a failure mechanism of the electrode line of the semiconductor device;

Figure 1:
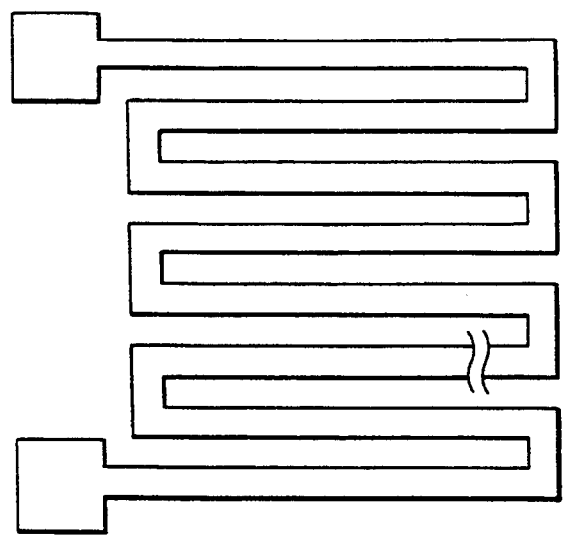
FIG. 1 is a plan view showing an example of a sample electrode line patterned on a semiconductor device according to the present invention.

In the present invention, the electrode line, arranged on a semiconductor chip or a semiconductor substrate, which electrically connects active regions (functional regions) made up of semiconductor junctions, may not only be of single layer structure consisting of a single crystal metal or a highly orientated polycrystalline metal, but also be of a multilayer structure consisting of either the combination of a single metal layer and a polycrystalline metal layer or of a polycrystalline metal layers, as long as the above-described requirements are met.

In the semiconductor device according to the present invention, the single crystal electrode line constituting the electrode line not containing grain boundaries is less susceptible to stress induced failure. The electrode line made of a single crystal metal is, of course, subjected to a stress, which is gradually relieved in some form as time elapses. The research made by the inventor and others indicates that the stress applied to the single crystal metal-made electrode line is relaxed in the form of void formation. However, in the case where the close-packed plane of the single crystal metal is formed parallel to the line, it has been found that the voids extend only along the line direction and that no voids which extend across the line grow.

Therefore, a laminated electrode line with an excellent endurance against stress induced failure can be obtained by arranging a single crystal electrode line in such a manner that the close-packed crystal plane of an electrode line forming crystal runs parallel to the line direction. In this case, although the arrangement most effective in improving the endurance against stress induced failure is to position the close-packed plane in parallel to the longitudinal direction of the line, an arrangement that the close-packed plane and the longitudinal direction of the line form an angle of 20° or less can also provide a remarkable improvement in endurance against stress induced failure. Angles of 10° or less provide a still better endurance against stress induced failure.

Although the direction of arrangement of interconnections on a semiconductor device is diverse in reality, the safety factor of endurance against stress induced failure with respect to the semiconductor device as a whole can be increased by taking the direction of a line that is the longest among lines of varying lengths as a longitudinal direction of the lines for the semiconductor device and by arranging the close-packed plane so as to form 20° or less with such line defining the longitudinal direction, and in addition, by providing a thicker line width for any line orthogonal to such line defining the longitudinal direction. For example, pure Al is used as a single crystal line material. Since pure Al is of the fcc structure, the angle formed between the different directions of lines connecting the individual elements (active regions) is maintained always at 60° so that each of all the lines can have its longitudinal direction arranged in parallel to its close-packed plane, thereby improving the ability to withstand stress induced failure.

Further, the deposition of polycrystalline parts on, below, or beside a single crystal line contributes to causing voids originally developing on the single crystal line to grow in these polycrystalline parts, thereby allowing voids to be eliminated from the single crystal line constituting the main line portion and preventing localized bottlenecking of lines. Thus, increase in line resistance can be prevented and reliability is ameliorated.

When an Al polycrystalline material is used, the endurance against stress induced failure of an electrode line can be increased by the arrangement that the normal line direction of the close-packed (111) plane of respective crystal grains forms 80° or less with that of the bottom surface of the line (surface that is in contact with the active region side through an insulating layer).

The close-packed plane which could satisfy the above requirement is, particularly, the (111) plane one forming 60° or less with the plane that is normal to the longitudinal direction of the line. The term "close-packed plane" as used herein often is intended to mean a plane satisfying the above-described requirement, and such a line is defined as "highly orientated line."

It goes without saying that any fcc structured single crystal line other than those made of pure Al as described above may likewise contribute to improving the endurance against stress induced failure.

In other crystal structures such as a bcc structure with the close-packed plane of (110) or an hcp structure with the close-packed plane of (0001), the similar effects can be obtained by so arranging that the close-packed plane forms 20° or less with the longitudinal direction of the line and that the normal line direction of the close-packed plane of the polycrystal line grains forms 80° or less with that of the bottom surface of the line (surface which is in contact with the active region side through an insulating layer). The endurance against stress induced failure improvement based on the rule of crystal orientation can be likewise given to single layer interconnections.

In the case where interconnections are arranged in multilayer form, excellent electromigration resistance and endurance against stress induced failure can be achieved by providing recesses and projections of, e.g., rectangular, triangular, or trapezoidal profile on the surface of a conductive layer whose resistivity is 200 μΩ·cm or less in the lower layer or on the surface of an insulating layer in the lower layer. It is because such an arrangement on the lower layer could improve the orientation of a conductive layer to be formed as an upper layer. Here, the above-described recesses and projections (grooves) are formed, preferably, in the following manner: the bottom surface runs parallel to the semiconductor substrate; the sidewall surfaces form about 90° or less with the bottom surface; the groove width is about 0.5 to 1.5 μm; the depth is about 500 to 1500 Å; and the groove pitch is about 0.5 to 1.5 μm.

In the case of a multilayer electrode line in which the lower layer surface is close-packed plane oriented and the normal line direction of the close-packed plane forms 10° or less with that of the bottom surface of the upper layer electrode line, it is preferable that one of the layers constituting the multilayer line be composed of Al, Cu, Au, Ag, or their alloy.

In the present invention, illustrative materials for forming an electrode line so that the close-packed plane is parallel to the longitudinal direction of the line include: fcc structured pure Al, Al-Cu, Al-Ti, Al-Cr, Al-Ta, Al-Mg, Al-In, Al-Li, pure Cu, Cu-Be, Cu-Ag, pure Au, Au-Pt, Au-Ag, Au-Pd, Au-Cu, pure Ag, or bcc structured pure W. When using the above-described alloys, it is desirable that the amount of addition of a solute be within the range allowing a complete solid solution to be formed. In this case, 1 wt % of Si may be contained as a solute. In the interest of designing, it is desirable that the close-packed plane come in the upper surface; i.e., the line be formed of a film of single crystal material which is close-packed plane oriented.

It has been confirmed that, if a refractory metal or its silicide, nitride, oxide, or carbide is coated on the single crystal metal line or the highly orientated polycrystalline line to ensure reliability, they are effective only when the electrode line is composed of a single crystal metal having no grain boundary.

That is, Ti was deposited on a silicon wafer surface having a thermally oxidized film by a sputtering method and Al was deposited on this Ti layer. The silicon wafer thus processed was then subjected to a thermal treatment at 450° C. for 1 hour. As a result, Ti was detected on the surface of the Al layer. The analysis of Ti contents within the Al layer indicated Ti segregation in the grain boundary. In the similar manner, TiN was deposited on a silicon wafer surface having a thermally oxidized film by a reactive sputtering method and Al was deposited on this TiN layer. The silicon wafer thus processed was then subjected to a thermal treatment at 450° C. for 1 hour. The result similar to the above was obtained. Further, an Al-0.5 wt % Cu alloy was deposited on a silicon wafer surface having a thermally oxidized film by the sputtering method and Ta was deposited on the Al-0.5 wt % Cu alloy layer again by the sputtering method. The silicon wafer thus processed was then subjected to a thermal treatment at 450° C. for 1 hour. An analysis on the texture of the 1–0.5 wt % Cu alloy after such a thermal treatment indicated that $TaCu_2$ was precipitated at the grain boundary.

On the other hand, single crystal Al was directly deposited on a silicon wafer surface by a thermal CVD method using tri-isobutyl-aluminum (TIBA, $[(CH_3)_2CH-CH_2]_3Al$) as a material and Ti was deposited on the Al layer. The silicon wafer thus processed was then subjected to a thermal treatment at 450° C. for 1 hour. An analysis on the interface between the Al layer and the Ti layer indicated no trace of both layers having reacted with each other.

In the present invention, illustrative materials for forming an electrode line by such an arrangement that the normal line direction of the close-packed plane of individual grains of an electrode line forming substance forms 80° or less with that of the electrode line bottom surface (surface which is in contact with the active region side through an insulating layer) include: fcc structured pure Al, Al-Cu, Al-Ti, Al-Cr, Al-Ta, Al-Mg, Al-In, Al-Li, and their alloys; pure Cu, Cu-Be, Cu-Ag, and their alloys; pure Au, Au-Pt, Au-Ag, Au-Pd, Au-Cu, and their alloys; and pure Ag; or bcc structured pure W. If the above-described alloys are used, it is desirable that the amount of addition of a solute be within the range allowing a complete solid solution to be formed. In this case, 1 wt % of Si may be contained as a solute.

The semiconductor device according to the present invention is specifically summarized as follows.

(a) In forming an electrode line using a single crystal material which does not contain any grain boundary leading to line failure, the close-packed plane of the crystal is arranged parallel to the longitudinal direction of the line thereby to allow a stress to be relieved at the interface between the electrode line and the passivation film.

(b) A laminated electrode line, whose lowermost electrode line is a single crystal line, is used.

(c) A laminated electrode line, whose uppermost electrode line is a single crystal line and whose lowermost electrode line is a polycrystalline line, is used.

(d) A laminated electrode line, in which a polycrystalline electrode line is arranged at least on or beside the single crystal electrode line, is used.

(e) A laminated electrode line, in which a polycrystalline metal part is partially arranged on the single crystal electrode line, is used.

(f) A laminated electrode line, in which a single crystal electrode line made of a single crystal substance whose crystal orientation is different from that of a single crystal substance forming a lowermost electrode line is laminated on the above-described lowermost electrode line, is used.

(g) The electrode line is of such structure that a thin film made of a single crystal substance different from a single crystal substance forming both first and second single crystal lines is arranged between the first and second single crystal lines constituting a laminated electrode line.

DETAILED DESCRIPTION OF THE PREFERRED EMBODIMENTS

Embodiments of the present invention will now be described.

Embodiment 1

Figure 2:
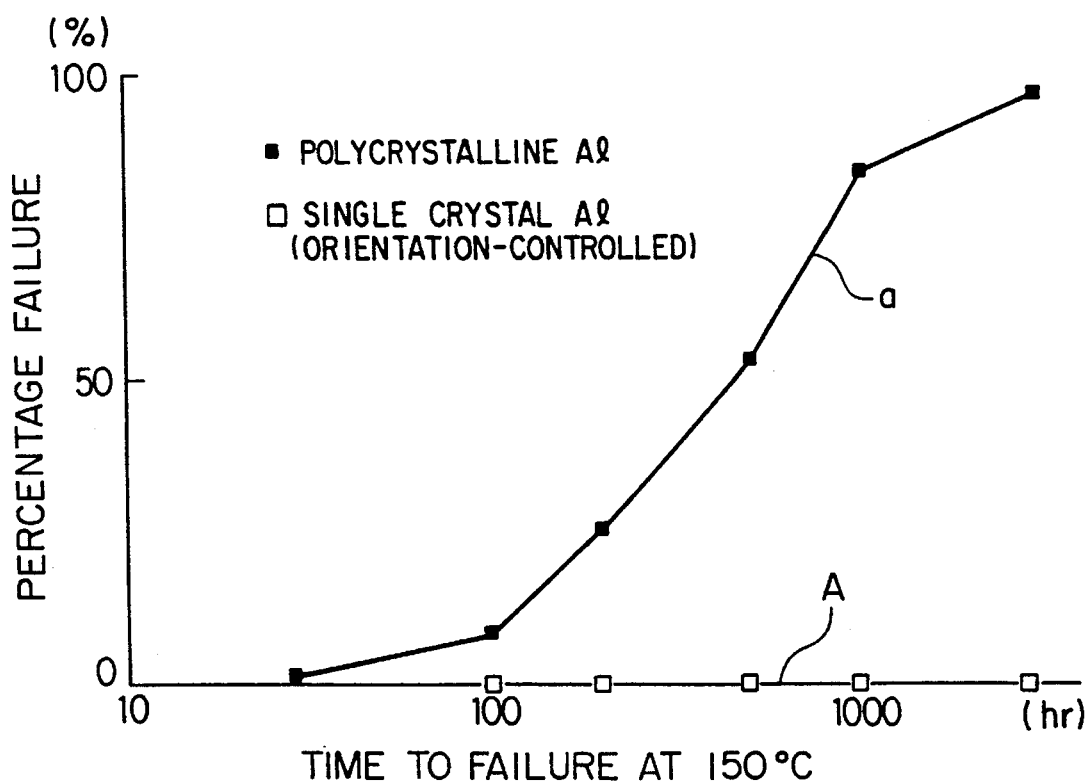
Figure 3A:
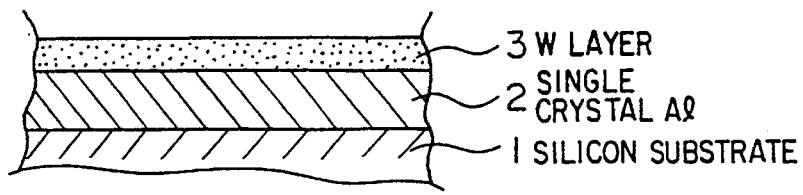
FIG. 3 (a) to (e), FIG. 5 (a) to (e), and FIG. 21 (a) to (c)
Figure 3B:
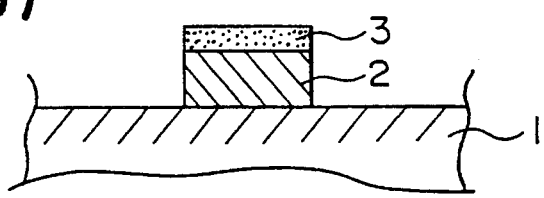
Figure 3C:
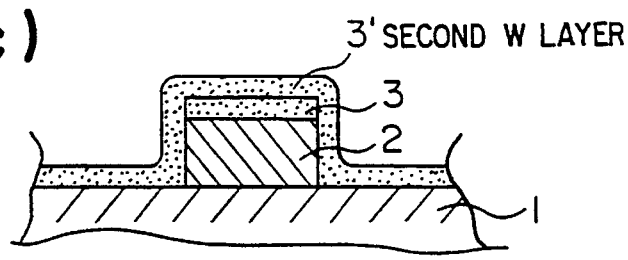
Figure 3D:
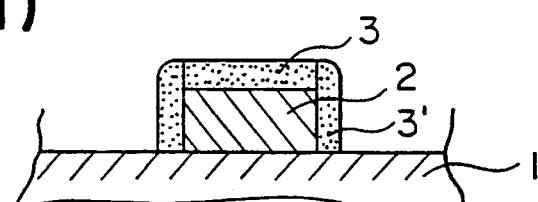
Figure 3E:
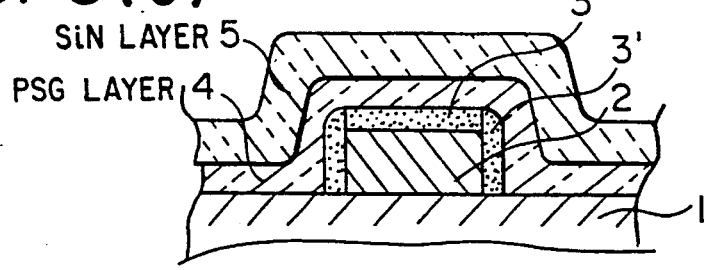

A (111) oriented single crystal Al film was formed 4000 Å thick on the surface of a (111) silicon substrate having active regions by a TIBA-based thermal CVD method. After identifying its crystal orientation by an X-ray based Laue method, an electrode line was patterned 0.5 μm wide and 1 m long as shown in FIG. 1 and arranged so that the (111) plane could be parallel to the longitudinal direction of the line. A P-doped $SiO_2$ (PSG) film and further a SiN film (by a plasma CVD method) were deposited 5000 Å and 7500 Å thick, respectively, to coat the surface of the silicon substrate having the electrode line thus patterned. The silicon substrate thus processed was then subjected to a high temperature test at 150° C. Curve A in FIG. 2 indicates the results of the test. No line failure was observed at 150° C. even after the elapse of 3000 hours.

For purposes of comparison, an electrode line formed under the same conditions except that it was made of polycrystalline Al was subjected to the same high temperature test. The results are as shown by curve a in FIG. 2.

Embodiment 2

A (111) oriented single crystal Al film 2 was formed 4000 Å thick on the surface of a (111) silicon substrate 1 having active regions by a TIBA-based thermal CVD method. Then, after identifying its crystal orientation by an X-ray based Laue method, a W film 3 was deposited on the single crystal Al film 2 1500 Å thick by a sputtering method as shown in FIG. 3 (a). Thereafter, an electrode line patterned 0.5 μm wide and 1 m long was arranged so that the (111) plane could be parallel to the longitudinal direction of the line (FIG. 3 (b)). Then, a second W film 3' was deposited 1500 Å thick by a tungsten fluoride-based CVD method (FIG. 3 (c)).

The W film 3' thus arranged was subjected to a highly anisotropic dry etching process to form a W-coated single crystal Al line (FIG. 3 (d)).

Figure 4:
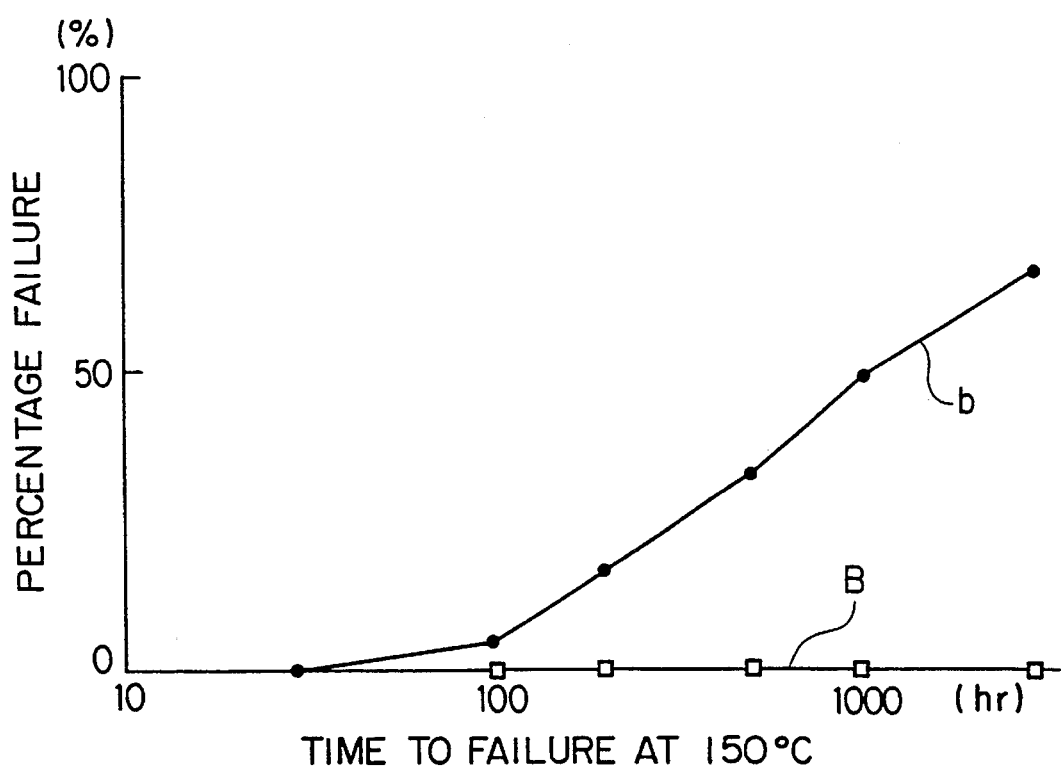
Figure 5A:
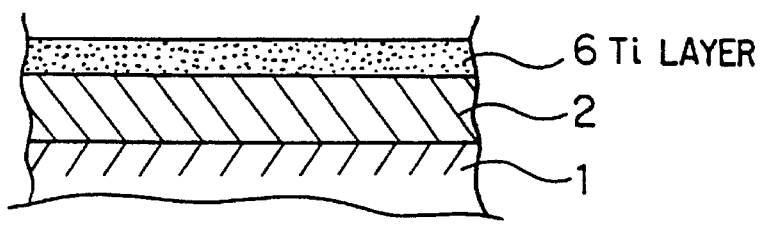
Figure 5B:
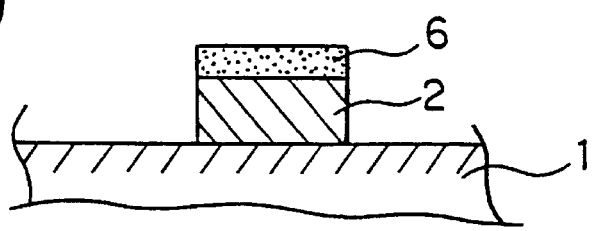
Figure 5C:
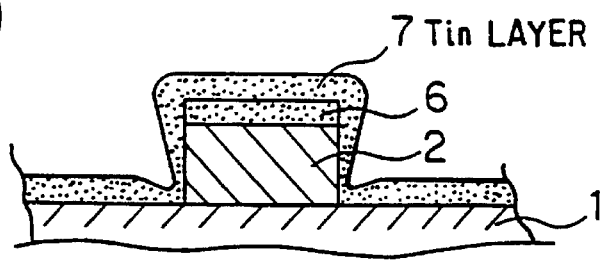
Figure 5D:
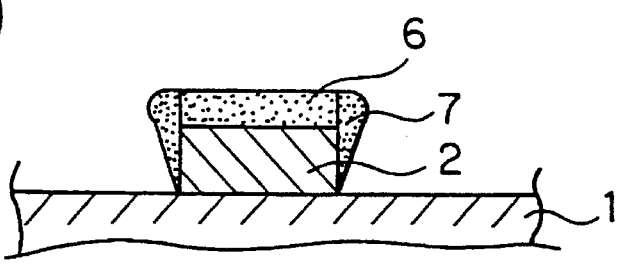
Figure 5E:
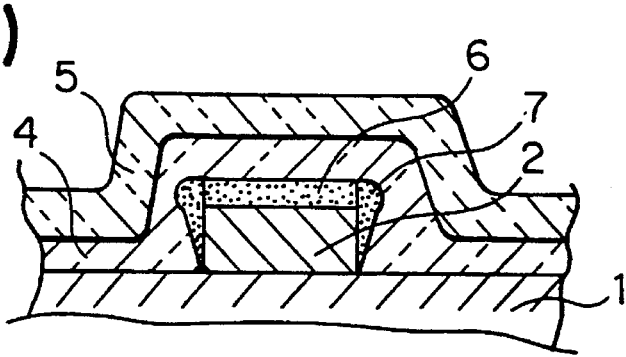

The electrode line formed silicon substrate had a PSG film 4 deposited 5000 Å thick and further a SiN film 5 7500 Å thick by a plasma CVD method (FIG. 3 (e)), and was then subjected to a high temperature test at 150° C. Curve B in FIG. 4 indicates the results of the test. No line failure was observed at 150° C. even after the elapse of 3000 hours. Here, the term "line failure" is defined as being a time when the rate of increase in line resistance exceeds 15%.

For purposes of comparison, an electrode line formed under the same conditions except that it was made of polycrystalline Al was subjected to the same high temperature test. The results are as shown by curve b in FIG. 4. As is apparent from the comparison, the electrode line according to the present invention exhibited an excellent endurance against stress induced failure.

Further, both interconnections were subjected to an electromigration test at 200° C. with a current density of $5 \times 10^6 / cm^2$. While not a single line failure was detected in the electrode line according to the present invention, the electrode line of the comparative example failed after the elapse of 3000 hours.

Embodiment 3

A (111) oriented single crystal Al film 2 was formed 4000 Å thick on the surface of a (111) silicon substrate 1 having active regions by a TIBA-based thermal CVD method. Then, after identifying its crystal orientation by an X-ray based Laue method, a Ti film 6 was deposited on the single crystal Al film 2 1500 Å thick by a sputtering method as shown in FIG. 5 (a). Thereafter, an electrode line patterned 0.5 μm wide and 1 m long was arranged so that the (111) plane could be parallel to the longitudinal direction of the line (FIG. 5 (b)). Then, a TiN film 7 was deposited 7500 Å thick by a reactive sputtering method (FIG. 5 (c)).

The TiN film 7 thus arranged was subjected to a highly anisotropic dry etching process to form a TiN-coated single crystal Al line (FIG. 5 (d)).

Figure 6:
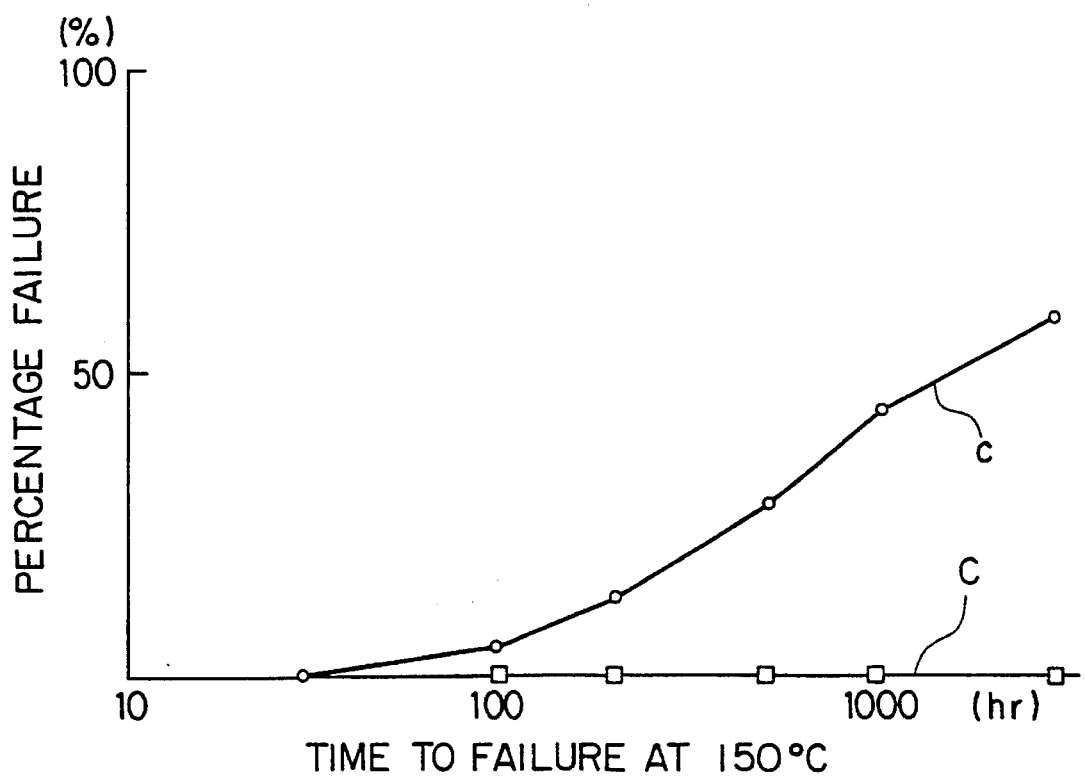

The electrode line formed silicon substrate had a PSG film 4 deposited 5000 Å thick and further a SiN film 5 7500 Å thick by the plasma CVD method (FIG. 5 (e)), and was then subjected to a high temperature test at 150° C. Curve C in FIG. 6 indicates the results of the test. No line failure was observed at 150° C. even after the elapse of 3000 hours.

Here again, the term "line failure" is defined as being a time when the rate of increase in line resistance exceeds 15%.

For purposes of comparison, an electrode line formed under the same conditions except that it was made of polycrystalline Al was subjected to the same high temperature test. The results are as shown by curve c in FIG. 6. As is apparent from the comparison, the electrode line according to the present invention exhibited an excellent endurance against stress induced failure.

Further, both interconnections were subjected to an electromigration test at 200° C. with a current density of $5 \times 10^6/cm^2$. While not a single line failure was detected in the electrode line according to the present invention, the electrode line of the comparative example failed after the elapse of 3000 hours.

Embodiment 4

A (111) oriented single crystal Al film 2 was formed 4000 Å thick on the surface of a (111) silicon substrate 1 having active regions by a TIBA-based thermal CVD method. The single crystal Al film 2 was then subjected to a reactive ion etching process to form a 1 µm wide line. Thereafter, a SiN interlayer insulating film 5' was formed 8000 Å thick by a plasma CVD method and a via hole 8 of about 0.8 µm in diameter was successively arranged by PEP and a chemical dry etching method.

Figure 7:
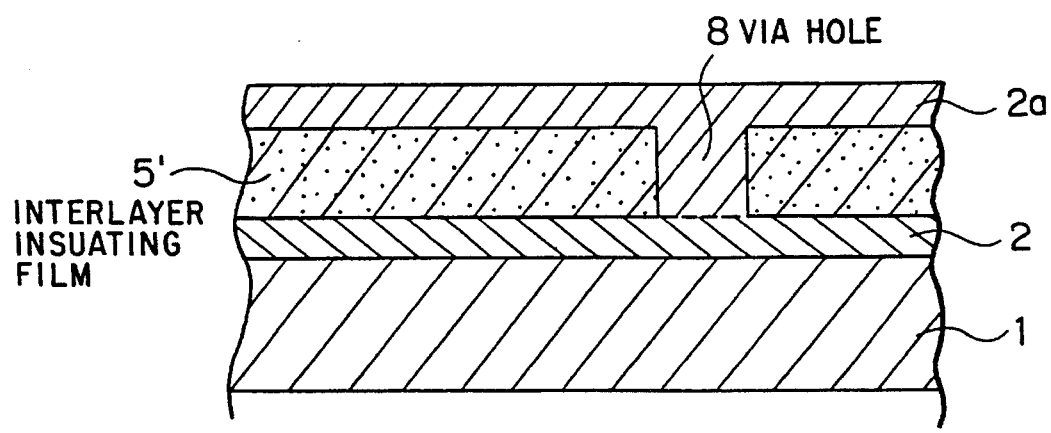
FIG. 7 is a sectional view showing another embodiment of the semiconductor device according to the present invention.

After the via hole 8 was arranged, the oxide film and the like were etched back from the bottom of the via hole 8, and a single crystal Al film 2a was then formed again by the thermal CVD method and patterned into a line of 1 µm in width thereby to obtain a semiconductor device having such a multilayer line as cross-sectionally shown in FIG. 7. In this case, the surface of the single crystal Al film 2 which was exposed by the removal of the oxide film and the like served as a nucleus for epitaxial growth. Thus, the Al film formed also on the SiN layer 5' was of single crystal structure.

For purposes of comparison, a semiconductor device was prepared under the same conditions except that the via hole was arranged by a thermal CVD, without going through the etch back process, to form the Al film or was etched back and then sputtered to form the Al film.

One hundred samples each of the two-layer type embodiment and comparative example, formed as described above, were prepared, and were subjected to an evaluation of electromigration resistance at the via hole portion at 200° C. with a current density of $5 \times 10^6$ A/cm² at the via hole portion. Upon detection of line failure on the half of the samples which had Al filled in the via hole by sputtering, the supply of current was stopped and the via hole portion of each sample was observed.

The via hole of the samples according to the present invention had the single crystal Al grown from the Al line in the lower layer, and no voids were detected within the via hole at all. On the other hand, in the samples which had Al filled in the via hole by sputtering, the via hole was not completely filled up, and thus 50 out of 100 samples exhibited line failure at the Al thin portions on the lateral sides of the via hole. In the samples which had Al filled in the via hole by the thermal CVD method without going through the etch back process, the grain size of Al was as small as about 0.2 µm, and a number of voids were observed at the grain boundaries. Line failure was detected at the via hole portion in 25 out of 100 samples.

Embodiment 5

A (111) oriented single crystal Al film was formed 4000 Å thick on the surface of a (111) silicon substrate having active regions by a TIBA-based thermal CVD method. Then, after identifying its crystal orientation by an X-ray based Laue method, an electrode line was patterned 0.5 µm wide and 1 m long into such a form as shown in FIG. 1 and arranged so that the (111) plane of the single crystal Al film could be parallel to the longitudinal direction of the line. A boron and phosphorus-doped glass was deposited to coat the single crystal electrode line as an interlayer insulating film, and a via hole was arranged below that glass layer to connect the line. Thereafter, Al was deposited on the glass layer 8000 Å thick by a sputtering method. Further, the deposited Al was patterned into a line of 1 µm in width and 1 m in length. Thereafter, a PSG film was deposited thereon 5000 Å thick and further a plasma SiN film 7500 Å thick as a protection film thereby to prepare a sample for high temperature test.

Figure 8:
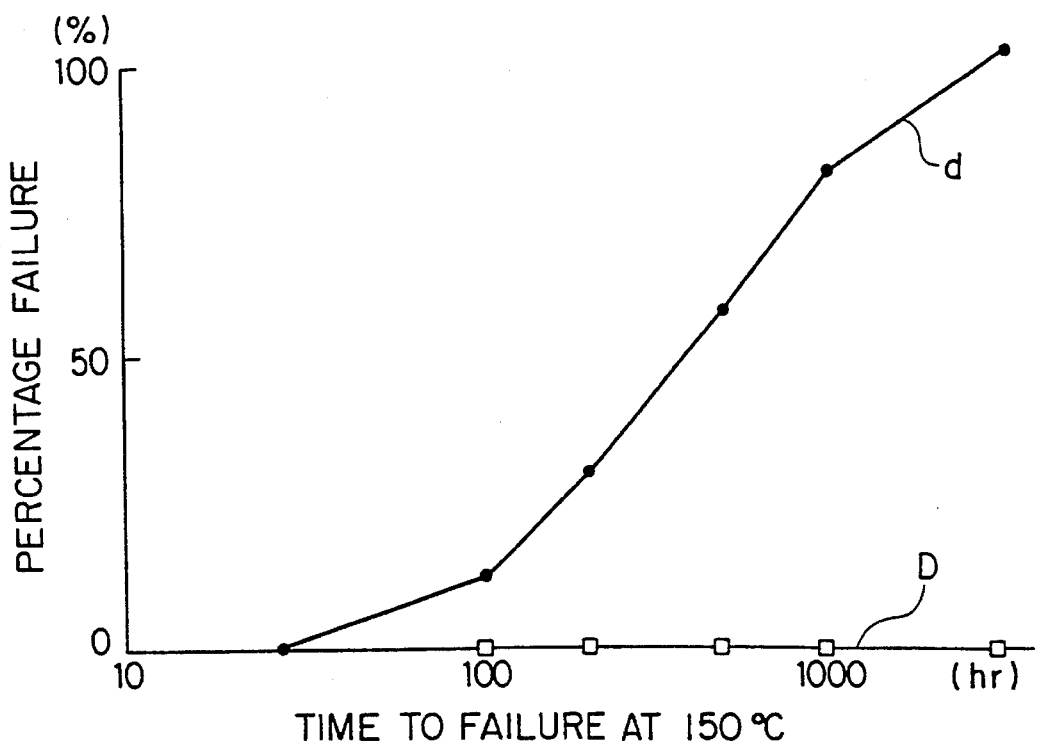

Then, this sample was subjected to a high temperature test while exposed to the air at 150° C. Curve D in FIG. 8 indicates the results of the test. No line failure was observed at 150° C. even after the elapse of 3000 hours in the single crystal Al electrode line of the lower layer.

For purposes of comparison, a polycrystalline Al line whose lowermost layer was deposited by a sputtering method was processed into the dimensions similar to those of the present embodiment and was subjected to a similar high temperature test. Curve d in FIG. 8 indicates the results of the test. Line failure was detected in this polycrystalline Al line, and therefore it is apparent that the single crystal electrode line is superior in endurance against stress induced failure to the polycrystalline electrode line.

Embodiment 6

After $SiO_2$ was deposited 8000 Å on a (100) silicon substrate having active regions, a (111) oriented polycrystalline Al film was formed 2000 Å thick by a dc magnetton sputtering method, and an Al-3 wt % Mg alloy film was successively deposited thereon 2000 Å thick. Thereafter, the silicon substrate thus processed was sintered at 450° C. for 15 min, the cross section of which was then subjected to transmission electron microscopy (TEM). While the grain size of the polycrystalline Al film was on the order of several microns, the grain size of the Al-3 wt % Mg alloy film was 1 to 3 mm.

Then, by taking one of the grains of the Al-Mg alloy film as a seed, from which a laser beam is irradiated by moving in one direction. As a result, a single crystal grew almost 4 cm² on the portion irradiated by the laser beam. This portion was patterned into an electrode line of 0.5 µm in width and 1 m in length in the form similar to FIG. 1. After depositing a PSG film thereon 5000 Å thick and further a plasma SiN film 7500 Å thick, the electrode line was subjected to a high temperature test at 150° C. in the air for 2000 hours.

For purposes of comparison, a (111) oriented single crystal Al film was formed 4000 Å thick on the surface of a (111) silicon substrate having active regions by a TIBA-based thermal CVD method, and the substrate thus arranged was processed into a pattern similar to the above, had PSG and plasma SiN films formed thereon, and then was subjected to a similar high temperature test.

As a result, the single crystal Al line according to the present invention did not fail but exhibited voids every several tens to several hundreds of microns meters.

On the other hand, in the case of the laminated line with the polycrystalline Al and the single crystal Al-Mg, the polycrystalline Al line portion exhibited not only voids every several microns but line failure as well. However, the single crystal Al-Mg alloy line portion in the upper layer had no voids and thus perfectly sound. This is because the deposition of the polycrystalline Al below the single crystal Al electrode line allowed stresses within both single crystal and polycrystalline portions to be selectively driven out into the grain boundaries of the polycrystalline portion as voids, thereby relieving these stresses. For this reason, the single crystal Al electrode line in the upper portion containing no grain boundaries could relax the stresses without any damage, thereby soundly performing a predetermined conduction function.

Embodiment 7

A (111) oriented single crystal Al film was formed 2000 Å thick on the surface of a (111) silicon substrate having active regions by a TIBA-based thermal CVD method. After identifying its crystal orientation by an X-ray based Laue method, a polycrystalline Al film was deposited 2000 Å by a dc magnetron sputtering method. Thereafter, an electrode line was patterned 0.5 μm wide and 1 m long into such a form as shown in FIG. 1 and arranged so that the (111) plane could be parallel to the longitudinal direction of the line. Thereafter, a PSG film was deposited 5000 Å thick and further a SiN film 7500 Å thick by a plasma CVD method to coat the electrode line formed silicon substrate, which was then subjected to a high temperature test at 150° C. in the air for 3000 hours.

Figure 9A:
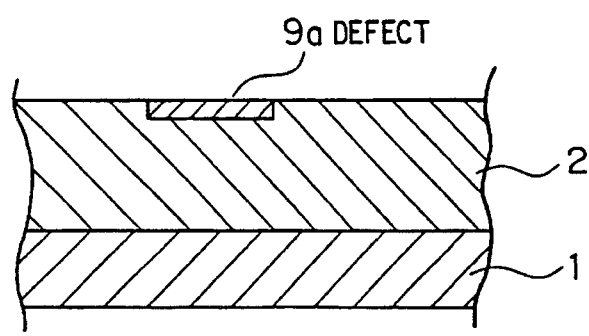
FIG. 9 (a) and (b) are schematics each showing the longitudinal sectional view of the electrode line of the semiconductor device after the reliability evaluation.
Figure 9B:
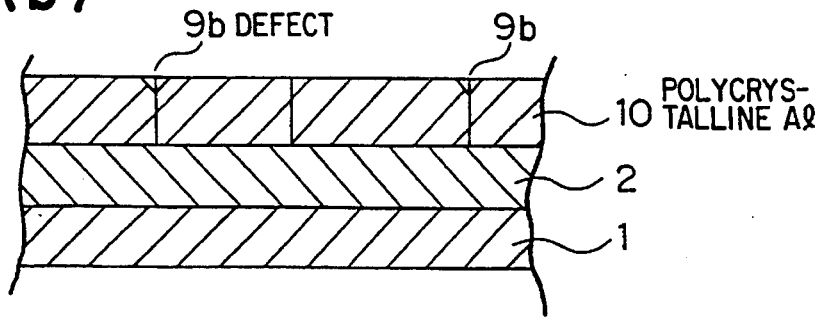

For purposes of comparison, a single crystal Al film was formed 4000 Å thick on the surface of a (111) silicon substrate having active regions by the same TIBA-based thermal CVD method, patterned into an electrode line of dimensions similar to those of the present embodiment (however, no consideration was given to the orientation), and subjected to a similar high temperature test. The results of the test are shown in Table 1. FIGS. 9 (a) and (b) are sectional views of the line portions after the test was conducted. Although no line failure was detected in the single crystal Al line of the comparative example, a void 9a of such form as shown in FIG. 9 (a) was observed. On the other hand, in the two-layer electrode line according to the present invention which had a polycrystalline Al layer deposited on the single crystal Al line layer, the polycrystalline Al line layer 10 exhibited not only a number of wedge-shaped voids 9b such as shown in FIG. 9 (b) but also line failure, whereas not a single void nor line failure was detected in the single crystal line layer, which thus maintained its conduction function as predetermined. This is because the stresses were selectively relieved at the grain boundaries of the polycrystalline line layer, thereby protecting the single crystal line layer.

TABLE 1

|  |  | Number of failed lines (lines/cm) | Number of voids (pcs/cm) |
| --- | --- | --- | --- |
| Embodiment | Polycrystalline layer | 1 | 426 |
|  | Single crystal layer | 0 | 0 |
|  | Comparative example | 0 | 89 |

The polycrystalline electrode line to be arranged at least above or beside the single crystal electrode line may be composed of a material of either the same kind as the single crystal electrode line or of different kind.

Embodiment 8

A (111) oriented single crystal Al film was formed 4000 Å thick on the surface of a (111) silicon substrate having active regions by a TIBA-based thermal CVD method. After identifying its crystal orientation by an X-ray based Laue method, a polycrystalline Al film was formed 3000 Å thick on the single crystal Al film by a dc magnetron sputtering method. Further, a photoresist solution was applied to the substrate thus formed for development, and the polycrystalline Al film was partially etched so as to obtain a structure in which the polycrystalline Al film was partially laminated. Then, an electrode line was patterned 0.5 μm wide and 1 m long into such a form as shown in FIG. 1 and arranged so that the (111) plane could be parallel to the longitudinal direction of the line. Thereafter, PSG and then plasma SiN₅ films were deposited 5000 Å thick and 7500 Å thick, respectively, to coat the electrode line formed silicon substrate, which was then subjected to a high temperature test at 150° C. in the air for 3000 hours. The length of the polycrystalline Al film on the single crystal Al was 1 μm and the distance between the polycrystalline Al films were 3 μm.

For purposes of comparison, a single crystal Al electrode line was also formed by the same method and in dimensions similar to the above (however, no consideration was given to the orientation) and was subjected to a similar high temperature test. Thereafter, three 1 cm long pieces were taken at random as samples (sample Nos. 1 to 3) along the 1 m long line and the number of voids in each piece was counted. The results are shown in Table 2. Many voids were observed in the single crystal Al line of the comparative example. However, the electrode line according to the present invention, in which the polycrystalline Al film was partially arranged on the single crystal Al line exhibited voids in the polycrystalline Al part but no void at all in the single crystal Al line part, thereby soundly maintaining the predetermined conductivity. This is because the stresses in the single crystal electrode line selectively developed into voids at the grain boundaries of the partially arranged polycrystalline Al metal, thereby allowing the single crystal Al electrode line containing no grain boundaries to relieve the stresses without any damage.

TABLE 2

|  | Number of voids (pcs/cm) | | |
| --- | --- | --- | --- |
|  | No. 1 | No. 2 | No. 3 |
| Embodiment | 0 | 0 | 0 |
| Comparative example | 103 | 115 | 89 |

The polycrystalline metal part to be arranged in contact with the single crystal Al electrode line may be composed of a material of either the same kind as the single crystal electrode line as in the case of the present embodiment or of a different kind.

Embodiment 9

A (111) oriented single crystal Cu film was formed 2000 Å thick on the surface of a (111) silicon substrate having active regions by a thermal CVD method using bishexafluoroacetylacetonate copper (Cu(HFA)₂). After identifying its crystal orientation by an X-ray based Laue method, a (100) oriented single crystal Al film was formed 2000 Å thick on the surface of the single crystal Cu film by a TIBA-based CVD method. Thereafter, an electrode line was patterned 0.5 μm wide and 1 m long into such a form as shown in FIG. 1 and arranged so that the Cu (111) plane could be parallel to the longitudinal direction of the line. Then, a PSG film and further a plasma SiN film were deposited 5000 Å thick and 7500 Å thick, respectively, to coat the electrode line formed silicon substrate thereby to prepare a sample for high temperature test.

The sample was subjected to a high temperature test at 150° C. in the air. As a comparative example, a polycrystalline Al line was formed by a conventional method into dimensions similar to those of the present embodiment and was subjected to a similar high temperature test.

Figure 10:
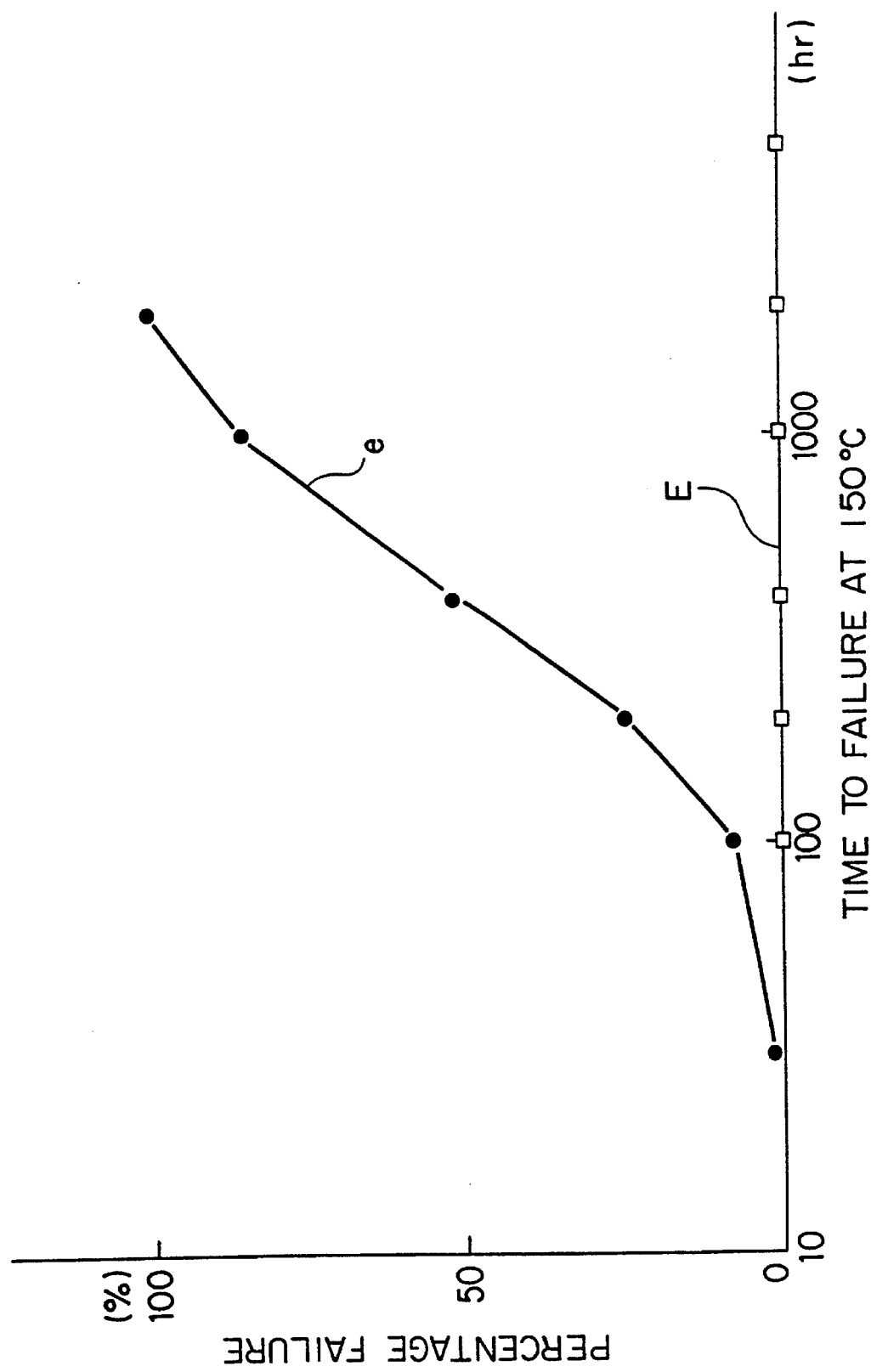

As a result, the single crystal laminated line according to the present invention presented no line failure at 150° C. even after the elapse of 5000 hours. On the other hand, the polycrystalline Al of the comparative example started to present line failure and voids after the elapse of 30 hours and when 2000 hours had elapsed, all their lines failed. The results are shown in FIG. 10, in which curve E indicates the characteristic of the present embodiment, whereas curve e, of the comparative example.

Embodiment 10

A (111) oriented first single crystal Al thin film was formed 2000 Å thick on the surface of a (111) silicon substrate having active regions by a TIBA-based thermal CVD method. After identifying its crystal orientation by an X-ray based Laue method, a (100) oriented second single crystal Al thin film was formed 2000 Å thick on the surface of the first single crystal Al thin film by the TIBA-based thermal CVD method.

The difference in orientation between the first and second crystal layers was controlled by changing the growth speed of each of the single crystal Al thin films. Thereafter, an electrode line was patterned 0.5 μm wide and 1 m long into such a form as shown in FIG. 1 and arranged so that the Al (111) plane of the upper layer single crystal thin film was parallel to the longitudinal direction of the line. Thereafter, a PSG film and further a plasma SiN film were deposited 5000 Å and 7500 Å thick, respectively, to coat the electrode line formed silicon substrate to prepare a sample for high temperature test.

The sample was subjected to a high temperature test at 150° C. in the air. As a comparative example, a thermal CVD prepared, single layered single crystal Al electrode line was formed into dimensions similar to those of the present embodiment (however, no consideration was given to the orientation and the like) and was subjected to a similar high temperature test.

As a result, the single layered single crystal line of the comparative example started to present line failure after 10000 hours had elapsed, whereas the single crystal multilayer line according to the present invention exhibited no failure at all.

In the arrangement as shown in embodiments 9 and 10, a single crystal multilayer line containing no grain boundaries was used and a different crystal orientation was given to each line, whereby, even if a line failure inducing notch grows in one line, the desired electric conductivity could be maintained by the other line having a different crystal orientation, so that it is possible to suppress the adverse effect of the notch developed within the line. Therefore, if the line of such an arrangement was used, endurance against stress induced failure induced failures can be controlled remarkably.

Although the single crystal electrode line can be multi-layered as many times as desired, two or three layers are preferable. Further, it is desirable that the first layer line have its close-packed plane arranged parallel to the longitudinal direction of the line. The desirable orientational relation between the first and second lines is such that: the <111> plane is 30° rotated in a fcc/fcc structure; the <110> plane is 45° rotated in a bcc/bcc structure; the <111> fcc plane is 45° rotated with respect to the <110> bcc plane in fcc/bcc structure; the <111> fcc plane is 30° rotated with respect to the <0001> hcp plane in a fcc/hcp structure. However, in a bcc/hcp structure, it is desirable that the <100> bcc plane be 30° rotated with respect to the <1121> plane. Here, a satisfactory effect can be obtained as long as the angle is within ±10°, or preferably, ±5°. It is desirable that a similar relationship be satisfied for the third layer onward. However, it goes without saying that the orientational relationship among these crystal structures is not limited to the examples as listed above.

Embodiment 11

A (111) oriented single crystal Al thin film was formed 2000 Å thick as a first layer on the surface of a (111) silicon substrate having active regions by a TIBA-based thermal CVD method. The underlayer temperature at the time the first thin film was prepared was 430° C. and the growth speed was 8000 Å/min. After identifying the crystal orientation of the single crystal Al film with the substrate by diffractometry, a single crystal Cu thin film ((111) oriented) was deposited 200 Å thick (substrate temperature: 400° C.) on the surface of the first single crystal Al thin film by a vacuum evaporation method, and a single crystal Al film ((111) oriented) was deposited thereon 2000 Å thick as a second layer in a manner similar to that in the first layer. Then, an electrode line was patterned 0.5 μm wide and 1 m long into such a form as shown in FIG. 1 and arranged so that the (111) plane could be parallel to the longitudinal direction of the line. Thereafter, a PSG film and further a plasma SiN film were deposited 5000 Å and 7500 Å thick, respectively, to coat the electrode line formed substrate, which was then subjected to a high temperature test at 150° C. in the air.

Figure 11:
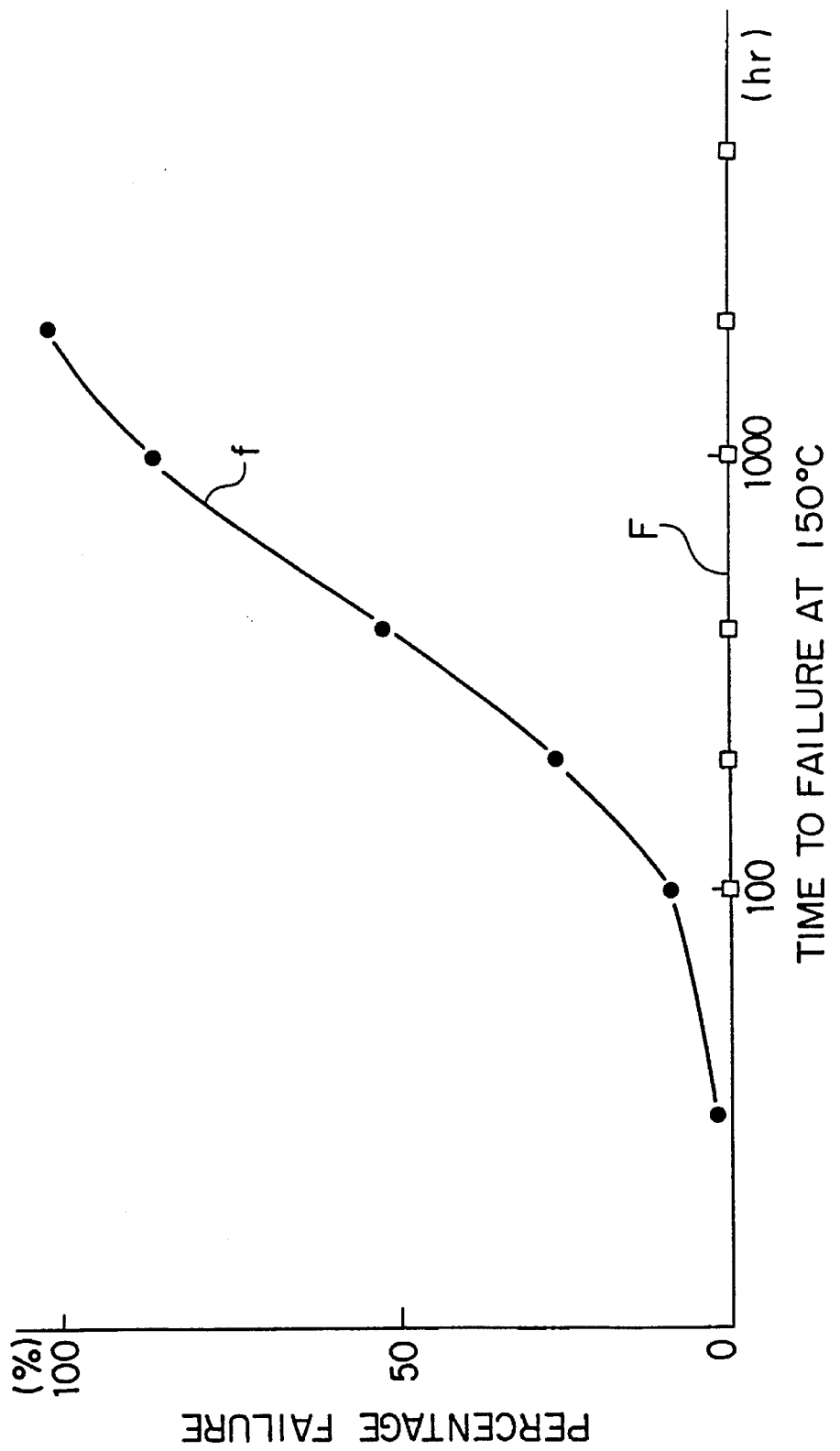

As a comparative example, a polycrystalline Al line prepared by the conventional dc magnetton sputtering method was formed into dimensions similar to those of the present embodiment by a conventional method, and was subjected to a similar high temperature test. As shown by curve F in FIG. 11, the single crystal Al multilayer line according to the present invention presented not a single line failure at 150° C. after the elapse of 5000 hours, whereas the polycrystalline Al line of the comparative example started to present line failure and voids only after 30 min had elapsed as shown by curve f and all its lines failed when 2000 hours had elapsed.

Embodiment 12

A (100) oriented single crystal Al-Si thin film was formed 2000 Å thick as a first layer on the surface of a (100) silicon substrate having active regions by a TIBA- and silane-based thermal CVD method. The underlayer temperature at the time the first thin film was formed was 370° C., and the growth speed was 8000 Å/min. After identifying the crystal orientation of the single crystal Al-Si thin film with the substrate by diffractometry, Au was deposited 2000 Å thick (100) oriented, (substrate temperature: 400° C.) on the surface of the first single crystal Al-Si thin film by a vacuum evaporation method, and a single crystal Al-Si film ((100) oriented) was deposited thereon 2000 Å thick as a second layer in a manner similar to that in the first layer. Then, an electrode line was patterned 0.5 μm wide and 1 m long into such a form as shown in FIG. 1 and arranged so that the (100) plane could be parallel to the longitudinal direction of the line. Thereafter, a PSG film and further a Si-rich plasma SiN film, which is more susceptible to stresses, were deposited 5000 Å and 15000 Å thick, respectively, to coat the electrode line formed silicon substrate, which was then subjected to a high temperature test at 150° C. in the air. As a comparative example, a single layered single crystal Al line prepared by a thermal CVD method was formed into dimensions similar to those of the present embodiment by a conventional method, and was subjected to a similar high temperature test.

As a result, the single layered single crystal Al line of the comparative example started to present line failure after the 10000 hours test had been terminated, whereas the single crystal Al multilayer line according to the present invention exhibited no line failure at all.

As is apparent from embodiments 5 and 12, if a single crystal thin film made of a material different from the multilayered single crystal thin film was interposed between the layers of the multilayered single crystal thin film in laminating the single crystal lines, a notch, if grown, can be suppressed by the presence of this interposed film. If the electrode line is of such an arrangement, there is no need whatsoever to limit the crystal orientation relationship between the single crystal lines, thereby allowing such an arrangement to be applied to various materials. A suitable interposed thin film material is one whose electric resistance is smaller than that of the single crystal line. Illustrative combinations of the electrode line forming materials include: (pure Al or an Al alloy/pure Cu/pure Al or an Al alloy), (pure Cu or a Cu alloy/pure Ag/pure Cu or a Cu alloy), (pure W or a W alloy/pure Ag/pure W or a W alloy), and (pure Al or an Al alloy/pure Au/pure W or W alloy).

The electrode line materials, and the combinations of materials for the first and second line and the thin film interposed therebetween may not be limited to those described above.

Embodiment 13

Figure 12:
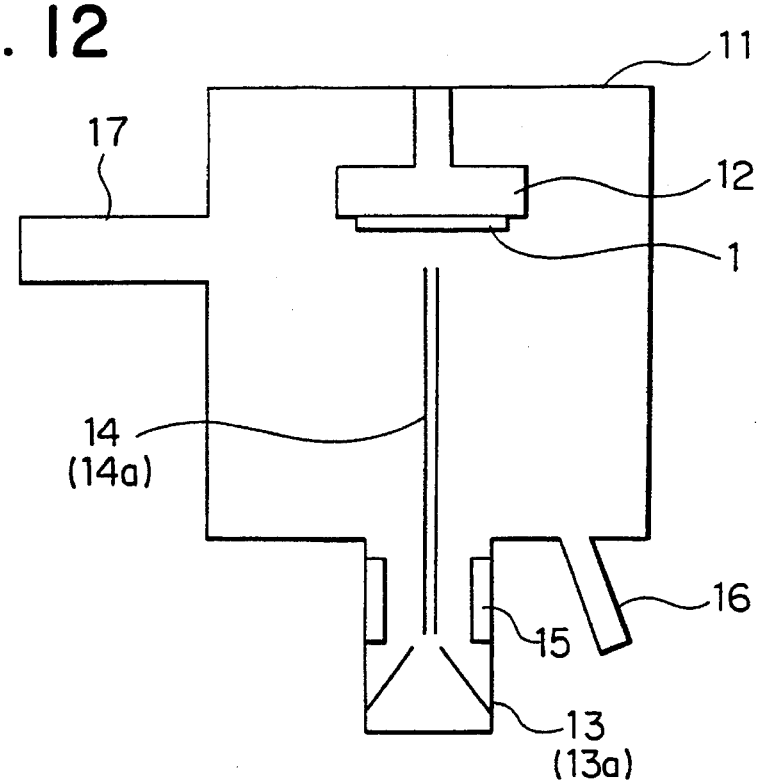
FIGS. 12, 24, 25, 32, 33, 34, and 35 are sectional views each showing the arrangement of the main portion of a thin film forming device used in forming an electrode line thin film of the semiconductor device according to the present invention.

A Si substrate having active regions and a thin $SiO_2$ film arranged thereon was prepared. Then, a stepped pattern and thin film forming apparatus, whose main construction is cross-sectionally shown in FIG. 12, was prepared.

Figure 13:
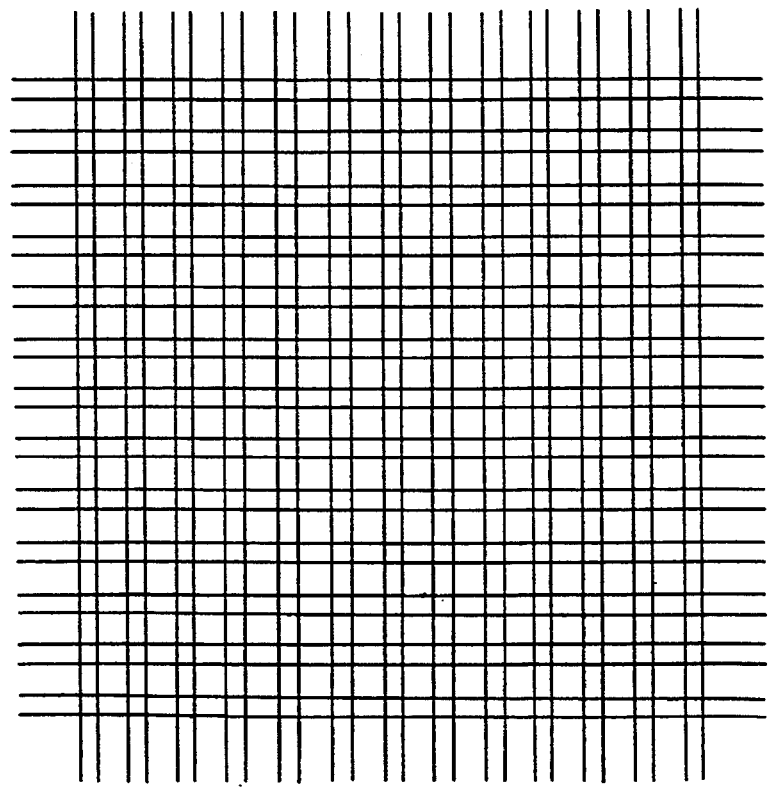
FIG. 13 is a plan view showing an example of a stepped electrode line of the semiconductor device according to the present invention.

The Si substrate 1 was held on an electrostatically adsorbing substrate holder 12 arranged within the stepped pattern and thin film forming apparatus 11. While the stepped pattern and thin film forming apparatus 11 was evacuated to $10^{-10}$ Torr and TIBA was adsorbed by the surface of the Si substrate 1 held on the electrostatically adsorbing substrate holder 12. Thereafter, TIBA was dissolved by irradiating an electron beam 14 from an electron gun 13, whose beam diameter was converged to several angstroms, onto the surface of the Si substrate 1 to form juxtaposed Al stripes of 3 Å in width and 8 Å in repetitive cycle while controlling the scanning direction by a deflection coil 15. Thereafter, a similar operation was performed by 90° turning the scanning direction thereby to obtain a lattice structure having a quaternary symmetry, whose plan view is shown in FIG. 13.

Then, from a K-cell 16 arranged within the stepped pattern and thin film forming apparatus, Al was deposited on the surface of the Si substrate 1 in 10 atomic layers. After verifying that each of these layers was of single crystal by a reflection electronic diffractometer 17, a (100) oriented single crystal Al film was formed 4000 Å thick by a TIBA-based thermal CVD method. The underlayer temperature in this case was 430° C. and the growth speed was 8000 Å/min.

Figure 14:
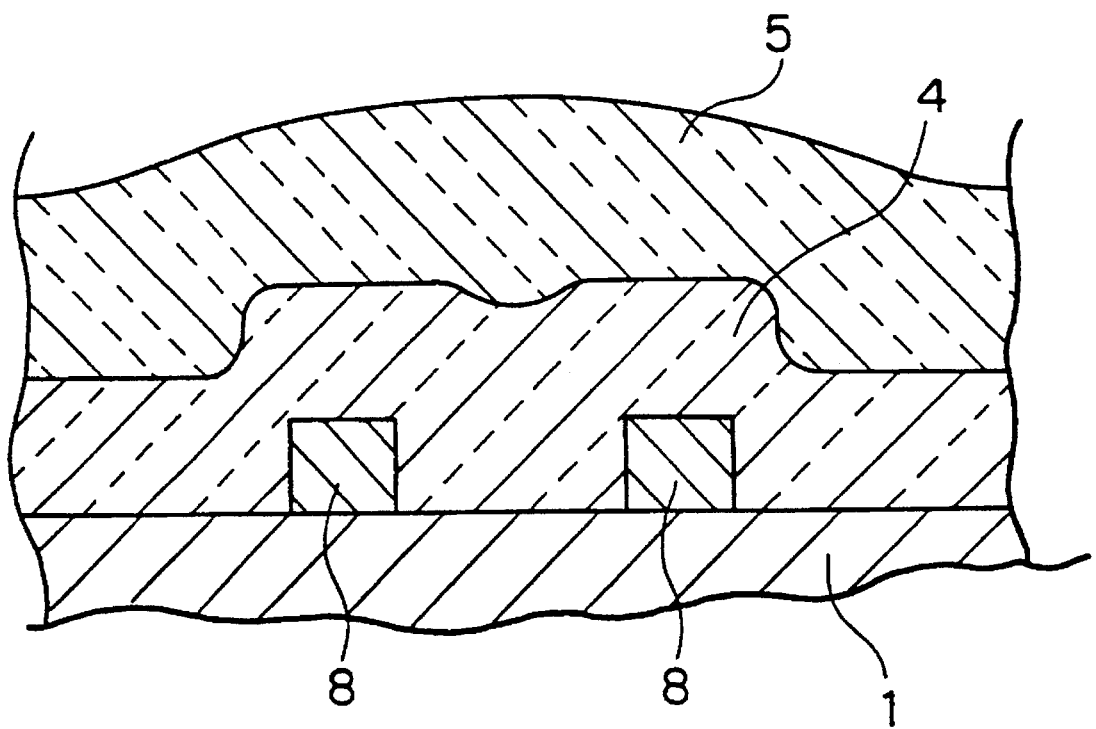
FIG. 14 is a sectional view of the main portion of the semiconductor device according to the present invention.

The single crystal Al film thus formed by the thermal CVD method was processed into an electrode line of 0.5 μm in width and 1 m in length as shown in FIG. 1 and arranged so that the (111) plane could be parallel to the longitudinal direction of the line. Thereafter, 5000 Å thick PSG layer 4 and 7500 Å thick plasma SiN layer 5 were sequentially formed on the electrode line 18 thereby to prepare a semiconductor device having such a cross-section as shown in FIG. 14.

For purposes of comparison, another semiconductor device was prepared under the same conditions except that the electrode line 18 was made of a polycrystalline Al film obtained by a dc magnetron sputtering method.

Figure 15:
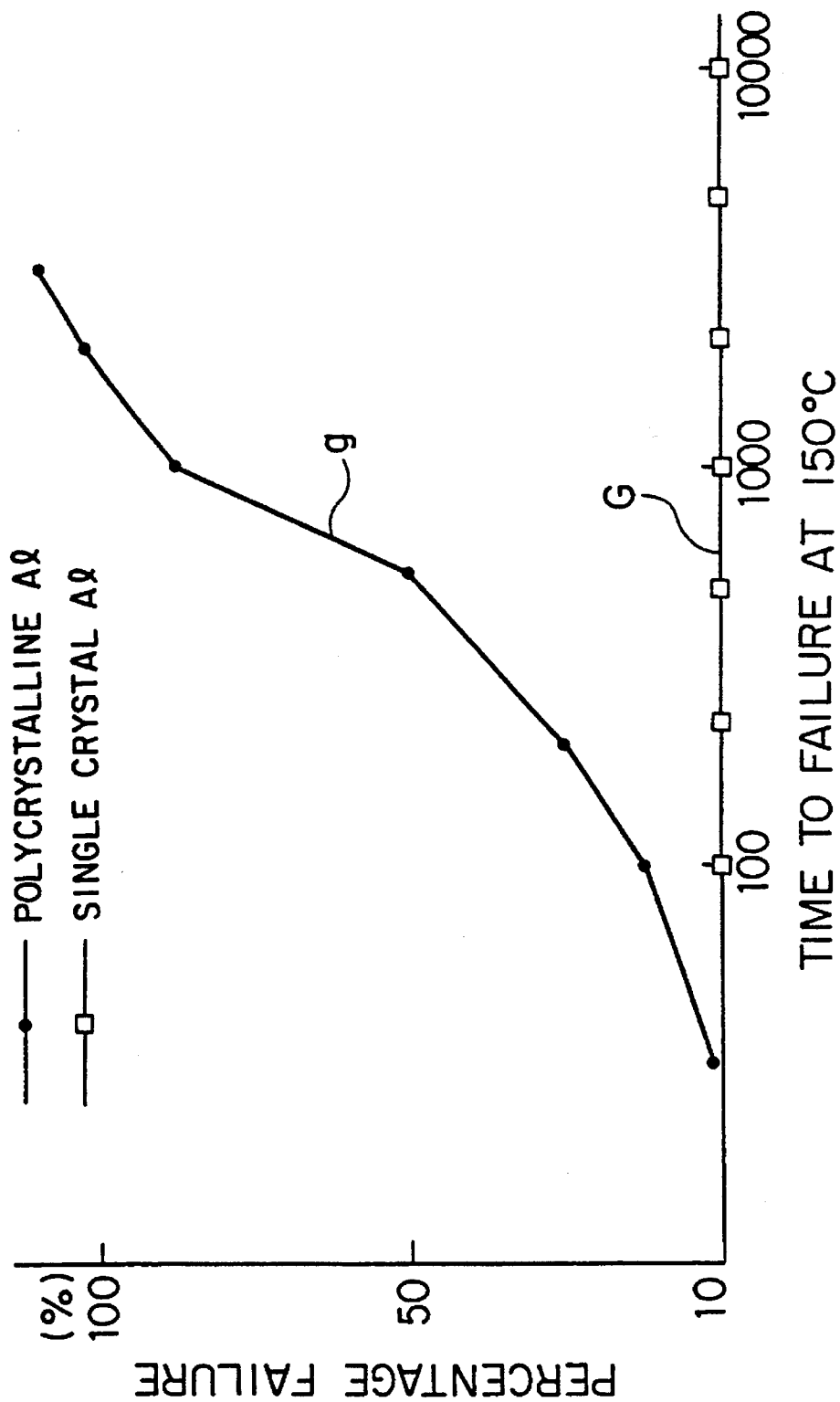

These semiconductor devices were subjected to a high temperature test at 150° C., the results of which are shown in FIG. 15. In the figure, curve G indicates the characteristic of the present embodiment, in which not a single line failure was exhibited even after the elapse of 10000 hours, whereas in curve g, indicating the characteristic of the comparative example, line failure voids were detected only after 30 hours had elapsed and all its lines failed after 2000 hours had elapsed.

Embodiment 14

A Si substrate having active regions and a thin $SiO_2$ film arranged thereon was prepared. Then, a stepped pattern and thin film forming apparatus, whose main arrangement is cross-sectionally shown in FIG. 12, was prepared (however, the electron gun was replaced by an ion source).

The Si substrate 1 was held on an electrostatically bonding substrate holder 12 arranged within the stepped pattern and thin film forming apparatus 11. While the stepped pattern and thin film forming apparatus 11 was evacuated to $10^{-10}$ Torr and TIBA was adsorbed by the surface of the Si substrate 1 held on the electrostatically adsorbing substrate holder 12. Thereafter, TIBA was dissolved by irradiating an ion beam 14a from an ion source 13a, whose beam diameter was converged to 1000 Å, onto the surface of the Si substrate 1 to form juxtaposed Al stripes of 1000 Å in width and 2 μm in repetitive cycle while controlling the scanning direction by a deflection coil 15.

Then, from a K-cell 16 arranged within the stepped pattern and thin film forming apparatus, Al was deposited on the surface of the Si substrate 1 in 10 atomic layers. After verifying that each of these layers was of single crystal by a reflection electronic diffractometer 17, a (111) oriented single crystal Al film was formed 4000 Å thick by a TIBA-based thermal CVD method. The underlayer temperature in this case was 430° C. and the growth speed was 8000 Å/min.

The single crystal Al film thus formed by the thermal CVD method was processed into an electrode line of 0.5 μm in width and 1 m in length as shown in FIG. 1 and arranged so that the (111) plane could be parallel to the longitudinal direction of the line. Thereafter, 5000 Å thick PSG layer 4 and 7500 Å thick plasma SiN layer 5 were sequentially formed on the electrode line 18 thereby to prepare a semiconductor device having such a cross-section as shown in FIG. 14.

For purposes of comparison, another semiconductor device was prepared under the same conditions except that the electrode line 18 was made of a polycrystalline Al film obtained by a dc magnetron sputtering method.

Figure 16:
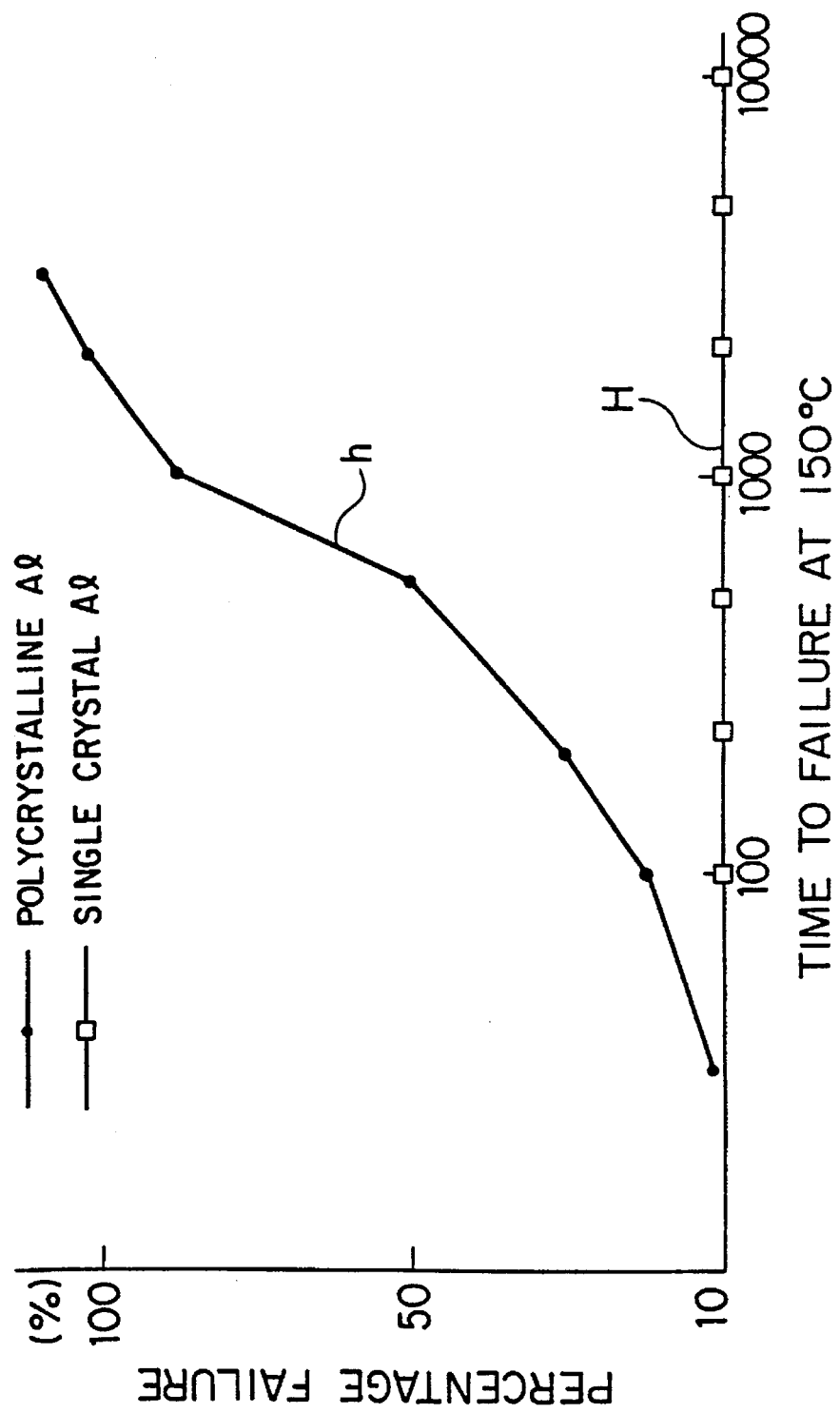

These semiconductor devices were subjected to a high temperature test at 150° C. the results of which are shown in FIG. 16. In the figure, curve H indicates the characteristic of the present embodiment, in which not a single line failure was exhibited even after the elapse of 10000 hours, whereas in curve h, indicating the characteristic of the comparative example, line failure voids were detected only after 30 hours had elapsed and all its lines failed after 2000 hours had elapsed.

Embodiment 15

In the present embodiment, an electrode line, which was composed of an underlayer whose crystal structure is hexagonal and which was formed in multilayer structure, has the ratio of the c-axis to a-axis of the hexagonal system set to 1.60 or more.

First, Ti, Zr, Mg, Zn, AlN, or NbN was deposited 500 Å thick on a silicon substrate having active regions and an 8000 Å thick $SiO_2$ film formed thereon by thermal oxidation. Then, an Al-1 wt % Si-0.5 wt % Cu film was deposited 4000 Å thick thereon by a dc magnetron sputtering method to form such a laminated film as listed below. The AlN and NbN films were formed by a reactive sputtering method.

Al-Si-Cu/Ti/$SiO_2$
Al-Si-Cu/Zr/$SiO_2$
Al-Si-Cu/Mg/$SiO_2$
Al-Si-Cu/AlN/$SiO_2$
Al-Si-Cu/Zn/$SiO_2$
Al-Si-Cu/NbN/$SiO_2$

The formed laminated films had 2 σ (Al (111)) fixed by X-ray diffractometry, and the orientation distribution of the Al (111) was measured by driving σ. The orientation distribution of the Al (111) had the following full width at half maximum as shown in Table 3. In the table, the ratio of the c-axis to the a-axis of the hexagonal layer arranged on the thermally oxidized layer, i.e., the surface (underlayer) with which Al-Si-Cu was in contact is also indicated. Here, the chemical composition of nitrides may be out of stoichiometric requirements.

TABLE 3

| Sample | c/a of hexagonal system | Full width at half maximum of Al—Si—Cu film (°) |
|---|---|---|
| Al—Si—Cu/Ti/$SiO_2$ | 1.588 | 6 |
| Al—Si—Cu/Mg/$SiO_2$ | 1.623 | 1 |
| Al—Si—Cu/Zr/$SiO_2$ | 1.593 | 8 |
| Al—Si—Cu/AlN/$SiO_2$ | 1.600 | 0.5 |
| Al—Si—Cu/Zn/$SiO_2$ | 1.856 | 2 |
| Al—Si—Cu/NbN/$SiO_2$ | 3.803 | 1.5 |

As is apparent from Table 3, the full width at half maximum of each Al-Si-Cu film whose c/a ratio of the hexagonal system is 1.600 or more is 1° to 2°, thereby being smaller than the full width at half maximum of Al-Si-Cu films whose c/a ratio is less than 1.600, which is 6° to 8°. Thus, the Al-Si-Cu film is highly (111) oriented.

The Al-Si-Cu/Ti/$SiO_2$ film and the Al-Si-Cu/Mg/$SiO_2$ film among the above samples were patterned into interconnections each of 0.5 μm in width and 1 m in length as shown in FIG. 1. Thereafter, a 5000 Å thick PSG layer and a 7500 Å thick plasma SiN layer were sequentially formed on the electrode line formed surfaces thereby to prepare semiconductor devices.

Figure 17:
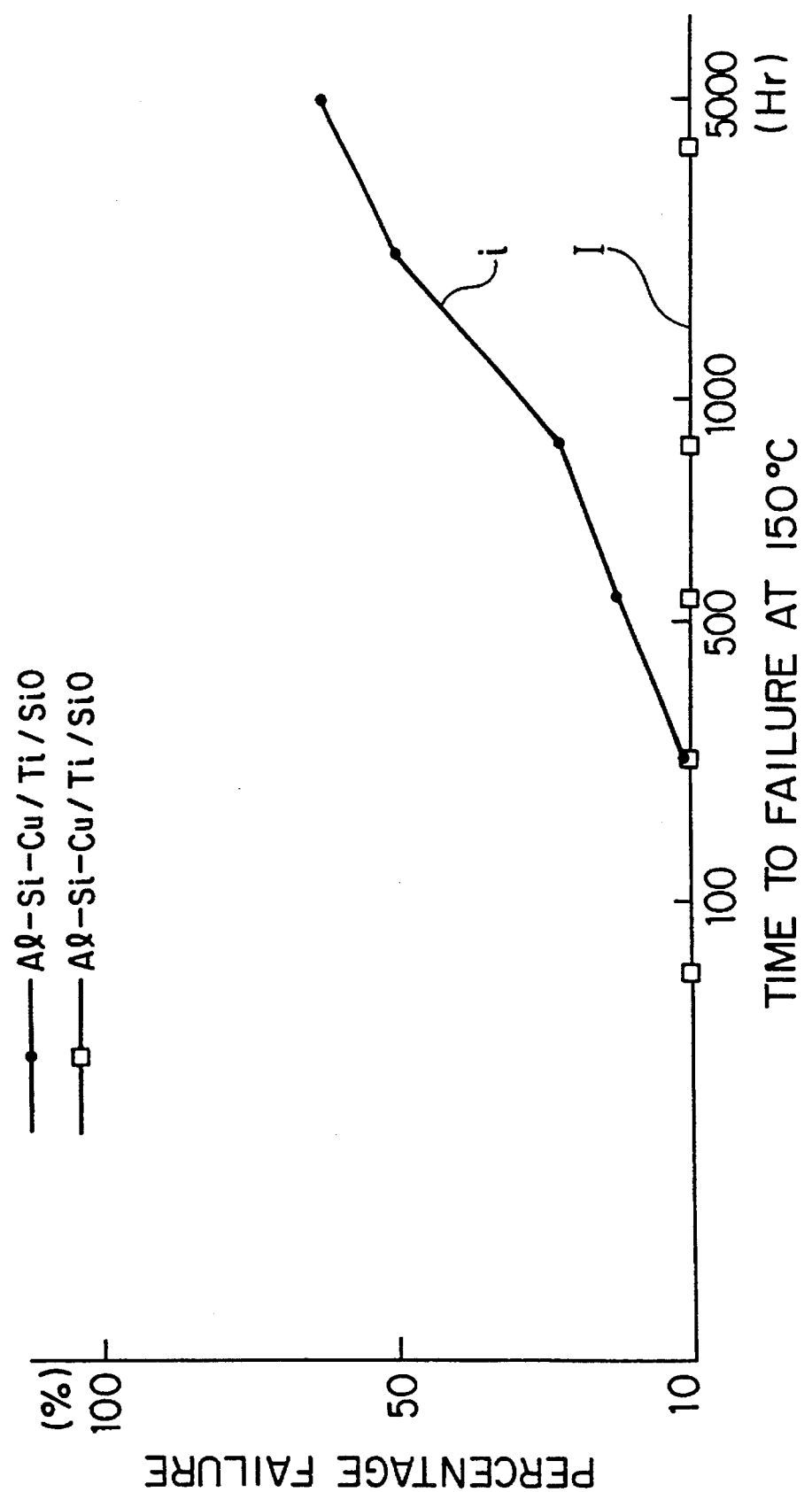

These semiconductor devices thus prepared were subjected to a high temperature test at 150° C. for 4000 hours, the results of which are shown in FIG. 17. In the figure, curve I indicates the characteristic of the present embodiment, in which no line failure was detected whatsoever even after the elapse of 4000 hours, whereas in curve i indicating the characteristic of the comparative example, a line failure ratio of 50% was observed after 4000 hours had elapsed.

In the case where each of the above-described laminated films was further multilayered as listed below, an effect or function similar to the above was observed.

Al-Si-Cu/Zr/Ti/$SiO_2$
Al-Si-Cu/Mg/Ti/$SiO_2$
Al-Si-Cu/AlN/Ti/$SiO_2$
Al-Si-Cu/Zn/Ti/$SiO_2$
Al-Si-Cu/NbN/Ti/$SiO_2$

Also, when the electrode line of the above laminated structure was composed of Al, Ag, Au, Cu, or an alloy of two or more of the above elements, an effect or function similar to the above was observed.

Embodiment 16

An Al film was formed 4000 Å thick by a vacuum evaporation method on the surface of a (100) silicon substrate having active regions and a thermally oxidized layer formed thereon. The film thus formed was an epitaxally grown polycrystalline film in which the Al <100> was in the same orientation as the silicon substrate <100>. All the normal lines of the close-packed {111} plane of the Al polycrystalline film formed 80° or less with the bottom surface of the line, i.e., the normal line of the silicon substrate.

The Al polycrystalline film was processed into an electrode line of 0.5 μm in width and 1 m in length as shown in FIG. 1. Thereafter, a 5000 Å thick PSG layer and a 7500 Å thick plasma SiN layer were sequentially deposited on the electrode line formed surface thereby to prepare semiconductor devices.

For purposes of comparison, an Al polycrystalline film was also formed by a sputtering method. The grains of this film were <111> oriented, and 7% of the grains had the angle formed between the normal line direction of the close-packed plane and the bottom surface of the line, i.e., the normal line direction of the silicon substrate surface in excess of 80°. This Al polycrystalline film was processed into an electrode line of 0.5 μm in width and 1 m in length as shown in FIG. 1. Thereafter, a 5000 Å thick PSG layer and a 7500 Å thick plasma SiN layer were sequentially deposited on the electrode line formed surface thereby to prepare semiconductor devices.

The semiconductor devices thus prepared were subjected to a high temperature test at 150° C. for 3000 hours, the results of which are shown in FIG. 18. In FIG. 18, curve J indicates the characteristic of the present embodiment, in which no line failure was exhibited even after the elapse of 3000 hours, whereas in curve J indicating the characteristic of the comparative example, the percentage failure was 70%.

The growth of voids was observed by overhauling the semiconductor devices after the above test, the results of which were as schematically shown in FIGS. 19 (a) and (b). As shown in FIG. 19 (a), in the case of the present embodiment in which the polycrystalline line was epitaxially grown in the <100> orientation, growth of voids was detected but no line failure was observed. On the other hand, the comparative example had voids grown along the close-packed plane substantially vertically with the line bottom surface, and the line failed by the slit-like voids.

Embodiment 17

A 200 Å thick Zn layer, a 500 Å thick ZrN layer, a 4000 Å thick Al film were sequentially formed by a magnetron sputtering method on the surface of a silicon substrate having active regions and an 8000 Å thick thermally oxidized layer formed thereon and then sintered at 450° C. for 15 min. While the silicon substrate temperature at the time the Zr film was grown was adjusted to room temperature, 100° C., 200° C., 300° C., and 500° C., other processes were performed at room temperature.

The above laminated films were processed into an electrode line of 0.5 μm in width and 1 m in length as shown in FIG. 1. When the electrode line was subjected to X-ray diffractometry under this condition, Al was (111) oriented, which was the close-packed plane of the fcc structure; and Zr was (002) oriented, which was the close-packed plane of the hcp structure. The orientation distribution of Al and Zr was measured by fixing 2 θ and driving only θ (θ-scanning) by X-ray diffraction thereby to measure the angle formed between the normal line direction of the close-packed plane of Al and Zr and that of the line bottom surface. The results are shown in Table 4.

TABLE 4

| Si substrate temperature direction when Zr film was formed of | Angle formed between line of close-packed plane and that line bottom surface (°) | |
| --- | --- | --- |
| (°C.) | Zr | Al |
| Room temperature | 4 | 4 |
| 100 | 8 | 10 |
| 200 | 15 | 20 |
| 300 | 20 | 28 |
| 500 | 30 | 45 |

As is apparent from Table 4, as the substrate temperature at the time the Zr film was formed changes, so does the crystal orientation distribution of Zr and Al.

Thereafter, a 5000 Å thick PSG layer and a 7500 Å thick plasma SiN layer were sequentially deposited on the electrode line formed surface thereby to form semiconductor devices.

These semiconductor devices were subjected to a high temperature test at 150° C. for 4000 hours, the results of which are as shown in FIG. 20. In FIG. 20 curves $K_1$, $K_2$, $K_3$, $K_4$, and $K_5$ are indicated in correspondence with room temperature, 100° C., 200° C., 300° C., and 500° C. In this laminated line structure, no line failure was detected at all in the case where the angle formed between the normal line direction of the Zr close-packed plane and that of the line bottom direction is 10° or less.

Embodiment 18

A 200 Å thick W layer, a 500 Å thick Zr or Ti layer, a 4000 Å thick Al film were sequentially formed by a sputtering method on the surface of a silicon substrate having active regions and an 8000 Å thick thermally oxidized layer formed thereon and then sintered at 450° C. for 15 min. While the silicon substrate temperature at the time the W and Zr or Ti films were grown was adjusted to room temperature, 100° C., 200° C. and 300° C. other processes were performed at room temperature.

The above laminated films were processed into an electrode line of 0.5 μm in width and 1 m in length as shown in FIG. 1. When the electrode line was subjected to X-ray diffractometry under this condition, Al was (111) oriented, which was the close-packed plane of the fcc structure; and Zr or Ti was (0001) oriented, which was the close-packed plane of the hcp structure. The orientation distribution of Al, Zr, and Ti was measured by fixing 2 θ and driving only θ (θ-scanning) by X-ray diffraction thereby to measure the angle formed between the normal line direction of the close-packed plane of Al, Zr, and Ti and that of the line bottom surface. The results are shown in Table 5. The values indicated at the left in the table are for the Al/Zr/W/Si)$_2$/Si structure, while those at the right for the Al/Ti/W/SiO$_2$/Si structure.

TABLE 5

| Silicon substrate failure temperature when Zr film was formed | Angle formed between line direction of close-packed plane and that of line bottom surface (°) | | Percent |
| --- | --- | --- | --- |
| (°C.) | Zr (Ti) | Al | (%) |
| Room temperature | 5/9 | 4/12 | 0/0 |
| 100 | 8/12 | 10/15 | 0/12 |
| 300 | 20/25 | 25/30 | 40/80 |

Thereafter, a 5000 Å thick PSG layer and a 7500 Å thick plasma SiN layer were sequentially deposited on the electrode line formed surface thereby to prepare semiconductor devices.

These semiconductor devices were subjected to a high temperature test at 150° C. for 4000 hours, the results of which are also shown in Table 5. In this laminated line structure, no line failure was detected at all in the case where the angle formed between the normal line direction of the close-packed plane of Zr or Ti constituting the lower layer and that of the line bottom direction is 10° or less.

Embodiment 19

A 200 Å thick W layer, a 500 Å thick AlN layer, a 4000 Å thick Al film were sequentially formed by a sputtering method on the surface of a silicon substrate having active regions and an 8000 Å thick thermally oxidized layer formed thereon.

The above laminated films were processed into an electrode line of 0.5 μm in width and 1 m in length as shown in FIG. 1. When the electrode line was subjected to X-ray diffractometry under this condition, Al was (111) oriented, which was the close-packed plane of the fcc structure; and AlN was (0001) oriented, which was the close-packed plane of the hcp structure. The orientation distribution of Al and AlN was measured by fixing 2 θ and driving only θ (θ-scanning) by X-ray diffraction thereby to measure the angle formed between the normal line direction of the close-packed plane of Al and AlN and that of the line bottom surface. The results are that AlN was 4° and that Al was also 4°.

Thereafter, a 5000 Å thick PSG layer and a 7500 Å thick plasma SiN layer were sequentially deposited on the electrode line formed surface thereby to prepare semiconductor devices.

When these semiconductor devices were subjected to a high temperature test at 150° C. for 4000 hours, the Al line on the AlN layer exhibited some voids but not a single line failure was observed.

For purposes of comparison, a 2000 Å thick $MoSi_2$ layer and a 4000 Å thick Al layer were formed on the thermally oxidized layer by a sputtering method. As a result of an X-ray diffraction, $MoSi_2$ was not oriented and Al was (111) oriented. The angles formed between the normal line direction of the Al layer (111) (the close-packed plane) and that of the line bottom surface were distributed in the range of 20° or more. This Al layer was processed into an electrode line of 0.5 μm in width and 1 m in length as shown in FIG. 1.

Thereafter, a 5000 Å thick PSG layer and a 7500 Å thick plasma SiN layer were sequentially deposited on the electrode line formed surface thereby to prepare semiconductor devices.

When these semiconductor devices were subjected to a high temperature test at 150° C. for 4000 hours, the Al line on the $MoSi_2$ layer exhibited a number of voids and line failure, and its percentage void after the elapse of 4000 hours was 85%.

Embodiment 20

A 200 Å thick Ti layer, a 500 Å thick TiN layer, a 4000 Å thick Al film were sequentially formed by a magnetron sputtering method on the surface of a silicon substrate having active regions and a 8000 Å thick thermally oxidized layer formed thereon.

The above laminated films were processed into an electrode line of 0.5 μm in width and 1 m in length as shown in FIG. 1. When the electrode line was subjected to X-ray diffractometry under this condition, Al was (111) oriented, which was the close-packed plane of the fcc structure; and Ti was (002) oriented, which was the close-packed plane of the hcp structure. The orientation distribution of Al and Ti was measured by fixing 2 θ and driving only θ (θ-scanning) by X-ray diffraction thereby to measure the angle formed between the normal line direction of the close-packed plane of Al and Ti and that of the line bottom surface. The results are that Ti was 5° and that Al was also 6°. Thereafter, a 5000 Å thick PSG layer and a 7500 Å thick plasma SiN layer were sequentially deposited on the electrode line formed surface, which was then subjected to a high temperature test at 150° C. for 4000 hours. As a result, the Al line on the Ti layer exhibited no voids at all.

For purposes of comparison, a 2000 Å thick $MoSi_2$ layer and a 4000 Å thick Al layer were formed on the thermally oxidized layer by a sputtering method. As a result of an X-ray diffraction, $MoSi_2$ was not oriented and Al was (111) oriented. The angles formed between the normal line direction of the Al layer (111) (the close-packed plane) and that of the line bottom surface were distributed in the range of 20° or more. This Al layer was processed into an electrode line of 0.5 μm in width and 1 m in length as shown in FIG. 1. Thereafter, a 5000 Å thick PSG layer and a 7500 Å thick plasma SiN layer were sequentially deposited on the electrode line formed surface, which was then subjected to a high temperature test at 150° C. for 4000 hours. As a result, the Al line on the $MoSi_2$ layer exhibited a number of voids and line failure, and its percentage void after the elapse of 4000 hours was 85%.

As is apparent from embodiments 17 and 20, if a high orientation layer is interposed on the bottom side of the electrode line so that the angle formed between the normal line direction of the line bottom surface and that of the close-packed plane of a material forming the electrode line can be within a predetermined range, the crystal orientation of the Al phase constituting the electrode line can be improved, thereby totally preventing line failure.

Embodiment 21

Figure 21A:
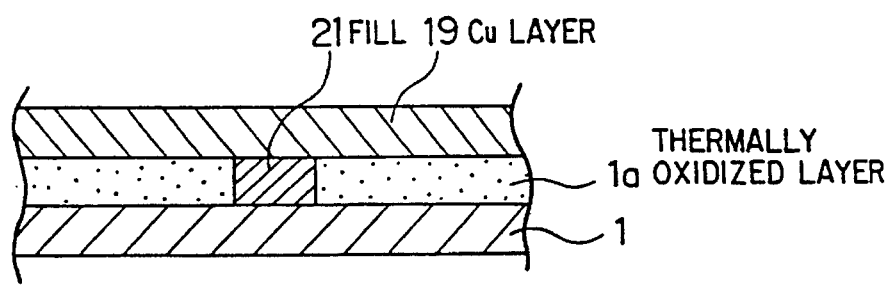
Figure 21B:
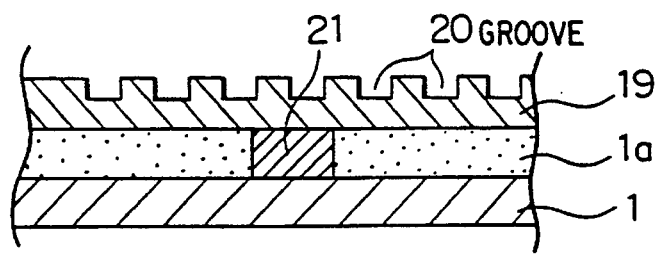
Figure 21C:
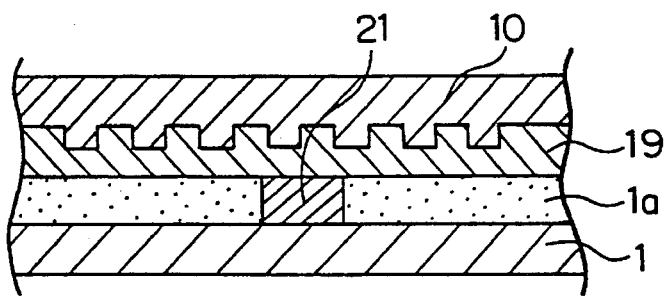

A 2000 Å thick Cu layer 19 was formed as a first metal layer by a magnetron sputtering method on the surface of a (100) silicon substrate 1 having active regions and an 8000 Å thick thermally oxidized layer 1a formed thereon (FIG. 21 (a)). The magnetron sputtering conditions were: a power output of 500 W, a pressure of $4\times10^{-3}$ Torr, and a deposition time of 15 sec.

The Cu film 19 thus deposited was subjected to X-ray diffractometry to identify its crystal orientation. As a result, the Cu film 19 was oriented so that the <111> plane was vertical with the silicon substrate 1, and its full width at maximum of the (111) diffracted wave measured by a θ scanning method was 8° to 10°.

Then, a 0.5 μm wide and 0.1 μm deep groove 20 was formed at a pitch of 0.1 μm on the first metal layer (Cu film) 19 by a reactive etching process thereby to make the surface irregular (FIG. 21 (b)).

A 3000 Å thick Al film 10 was deposited as a second metal layer on the irregular surface of the Cu film by a dc magnetron sputtering method (FIG. 21 (c)). The deposition conditions in this case were similar to those in forming the first metal layer except that the deposition time was 22.5 sec. In FIG. 21, reference numeral 21 designates a contact hole filling metal.

Then, the formed Al film was subjected to a thermal treatment by a rapid thermal anneal method at 500° C. for 30 sec. Then, when the crystal orientation of the Al film was measured by X-ray diffractometry (θ scanning), the full width at maximum of the (111) diffraction line was about 1.6°, which was a satisfactory orientation.

Figure 22:
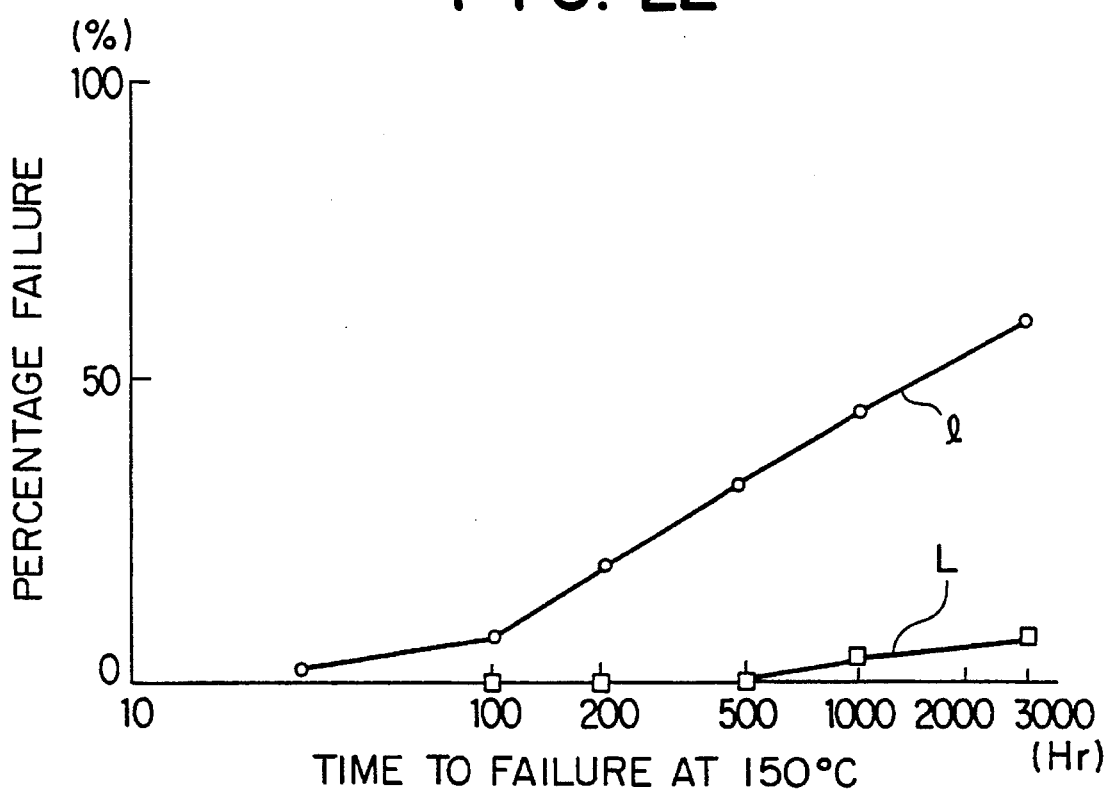

The laminated film was processed into an electrode line of 0.5 μm in width and 1 m in length and a 5000 Å thick PSG layer and a 7500 Å thick plasma SiN layer were sequentially deposited on the line surface, which was then subjected to a stress induced failure test. The results of which are shown by curve L in FIG. 22. In the figure, curve 1 indicates the results of a similar stress induced failure test conducted on an electrode line for comparison, which was identical except that the surface of the first metal layer was not made irregular.

When the 0.5 μm wide electrode line was subjected to an electromigration test with a current density of $5\times10^6$ A/cm$^2$ at 200° C. its resistance was increased. This increase in resistance contributed to improving the life about 10 times as long as the conventional Al-Si-Cu electrode line.

In the above arrangement, the groove or irregularities formed on the surface of the first metal layer may take such forms as rectangular, triangle, or trapezoidal in cross-section. Its width may be about 0.5 to 1.0 μm, its depth, about 500 to 1000 Å, and its pitch, about 1.0 to 1.5 μm.

Further, in the above, preferable metals for forming the second metal layer include Al, Ag, Au, and Cu, and generally one being of the same crystal system as, and having a melting point lower than, the metal of the first metal layer.

Embodiment 22

A 1000 Å thick TiN layer (resistivity: 200 μΩ·cm) was formed as a first metal layer by a dc magnetron sputtering method on the surface of a (100) silicon substrate having active regions and an 8000 Å thick thermally oxidized layer formed thereon. The dc magnetron sputtering conditions were: a power output of 500 W, a pressure of $4\times10^{-3}$ Torr, and a deposition time of 20 sec.

The TiN film thus deposited was subjected to X-ray diffractometry to identify its crystal orientation. As a result, the TiN film was oriented so that the <111> plane was vertical with the silicon substrate 1, and its full width at maximum of the (111) diffracted wave measured by a scanning method was 8° to 10°.

Then, a 0.5 μm wide and 0.1 μm deep groove 20 was formed at a pitch of 1 μm on the first metal layer (Tin film) by a reactive etching process thereby to make the surface irregular.

A 3000 Å thick Al film was deposited as a second metal layer on the irregular surface of the TiN film by a dc magnetron sputtering method. The deposition conditions in this case were similar to those in forming the first metal layer except that the deposition time was 30 sec.

Then, the formed Al film was subjected to a thermal treatment by a rapid thermal anneal method at 500° C. for 60 sec. Then, when the crystal orientation of the Al film was measured by X-ray diffractometry (θ scanning), the full width at maximum of the (111) diffraction line was about 1.8°, which was a satisfactory orientation.

Figure 23:
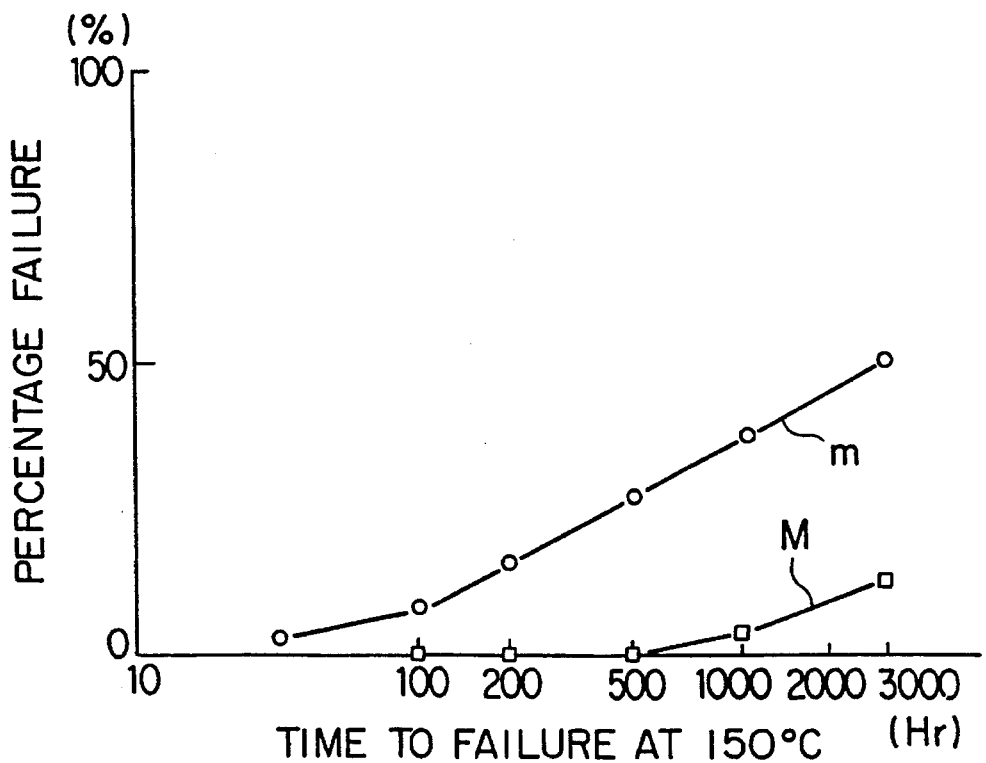

The laminated film was processed into an electrode line of 0.5 μm in width and 1 m in length and a 5000 Å thick PSG layer and a 7500 Å thick plasma SiN layer were sequentially deposited on the line surface, which was then subjected to a stress induced failure test. The results of which are shown by curve M in FIG. 23. In the figure, curve m indicates the results of a similar stress induced failure test conducted on an electrode line for comparison, which was identical except that the surface of the first metal layer was not made irregular.

When the 0.5 μm wide electrode line was subjected to an electromigration test with a current density of $5\times10^{6}$ A/cm² at 150° C. its resistance was increased. This increase in resistance contributed to improving the life about 10 times as long as the conventional Al-Si-Cu electrode line.

In the above arrangement, the groove or irregularities formed on the surface of the first metal layer may take such forms as rectangular, triangle, or trapezoidal in cross-section. Its width may be about 0.5 to 1.0 μm, its depth, about 500 to 1000 Å, and its pitch, about 1.0 to 1.5 μm.

Further, in the above, preferable metals for forming the second metal layer (conductive layer) include Al, Ag, Au, and Cu, and generally one being of the same crystal system as the metal of the first metal layer whose resistivity is 200 μΩ·cm or less, and having a melting point lower than that metal of the first metal layer. It is desirable that the second metal layer be subjected to a thermal treatment at a temperature 100° to 200° C. lower than its melting point to provide it with a satisfactory orientation. The second metal layer should be thermally treated for about 30 sec to 5 min in case of a lamp anneal, and about 20 to 40 min in case of annealing in electric arc furnace.

Embodiment 23

Figure 24:
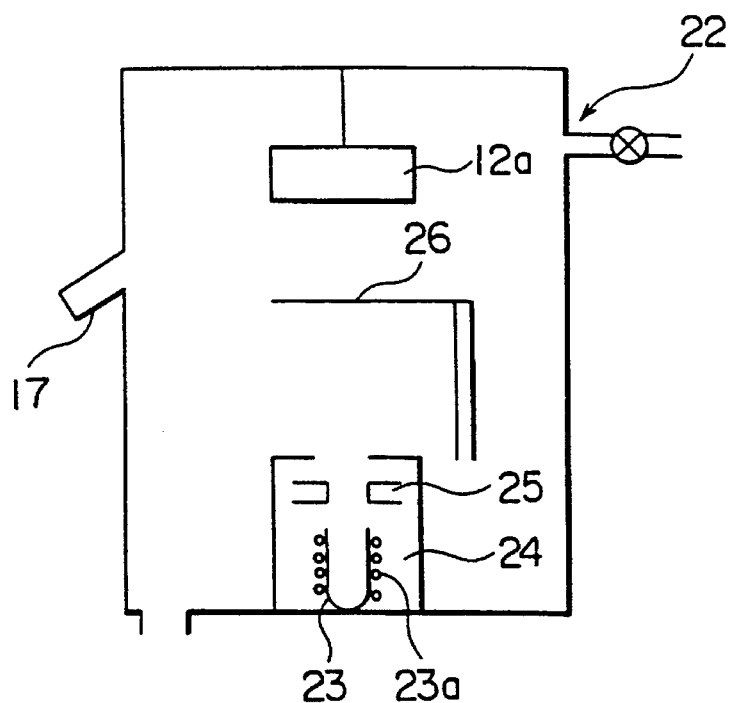

A silicon substrate having active regions and a 5000 Å thick amorphous oxide layer formed thereon was prepared, and this silicon substrate was placed on a substrate holder 12a within a vacuum vessel 22 of a thin film forming apparatus whose main portion is shown cross-sectionally in FIG. 24. After the vacuum vessel 22 was evacuated to $1\times10^{-10}$ Torr, the surface of the silicon substrate was heated to 1000° C. and cleaned.

Thereafter, the temperature of the silicon substrate was set to 250° C., a temperature for forming a thin film. While Al was evaporated from a molecular beam epitaxy (MBE) evaporation source 23 having a heater 23a, an electric discharge chamber 24 was evacuated to about $1\times10^{-5}$ Torr and voltage was applied to an electric discharge electrode 25 thereby to start electric discharge to dissolve the evaporated Al in a monatomic form. Then, the Al dissolved in a monaromic form was deposited on the silicon substrate by opening a shutter 26. The electric discharge conditions were: a discharge gap voltage of 1 kV and a discharge current of 400 mA.

The Al film to be thus formed was deposited at a growth speed of 10 μm/h with a high energy reflection electron diffractometer 17 while observing its crystallinity on the spot. The Al film thus formed was subjected to transmission electron microscopy, the result of which was a satisfactory single crystal film having no voids. The surface of the Al single crystal film which was in contact with the amorphous oxide layer formed the close-packed plane.

The single crystal Al film thus formed was processed into an electrode line of 0.5 μm in width and 1 m in length as shown in FIG. 1 and arranged so that the close-packed plane could be parallel to the longitudinal direction of the line. Thereafter, a 5000 Å thick PSG layer and a 7500 Å thick plasma SiN layer were sequentially formed on the electrode line formed surface, which was then subjected to a high temperature test at 150° C. The electrode line thus formed exhibited no line failure even after the elapse of 10000 hours.

For purposes of comparison, when a conventional MBE method was employed in growing the single crystal Al and forming the Al film, the growth speed was 1 μm/h with the substrate temperature set to 400° C., thereby entailing a longer time in preparing semiconductor devices.

Embodiment 24

A silicon substrate having active regions and a 5000 Å A thick amorphous oxide layer formed thereon was prepared, and this silicon substrate was placed on a substrate holder 12a within a vacuum vessel 22 of a thin film forming apparatus whose main portion is shown cross-sectionally in FIG. 24. After the vacuum vessel 22 was evacuated to $1\times10^{-10}$ Torr, the surface of the silicon substrate was heated to 1000° C. and cleaned. Then, ozones were introduced so that the pressure within the vacuum vessel 22 was increased to about $1\times10^{-8}$ Torr, and hydrogen adsorbed on the surface of the silicon substrate was replaced by oxygen.

Thereafter, the temperature of the silicon substrate was set to 250° C., a temperature for forming a thin film. While Al was evaporated from an MBE evaporation source 23 having a heater 23a, an electric discharge chamber 24 was evacuated to about $1\times10^{-5}$ Torr and voltage was applied to an electric discharge electrode 25 thereby to start electric discharge to dissolve the evaporated Al in a monatomic form. Then, the Al dissolved in a monatomic form was deposited on the silicon substrate by opening a shutter 26. The electric discharge conditions were: a discharge gap voltage of 1 kV and a discharge current of 400 mA.

The Al film to be thus formed was formed with a high energy reflection electron diffractometer 17 while observing the crystallinity for the first 10 atomic layers on the spot, and thereafter at a growth speed of 1 to 10 μm/h. The Al film thus formed was subjected to transmission electron microscopy, the result of which indicates that it was a satisfactory single crystal film having no voids. The surface of the Al single crystal film which was in contact with the amorphous oxide layer formed the close-packed plane.

The single crystal Al film thus formed was processed into an electrode line of 0.5 μm in width and 1 m in length as shown in FIG. 1 and arranged so that the close-packed plane could be parallel to the longitudinal direction of the line. Thereafter, a 5000 Å thick PSG layer and a 7500 Å thick plasma SiN layer were sequentially formed on the electrode line formed surface, which was then subjected to a high temperature test at 150° C. The electrode line thus formed exhibited no line failure even after the elapse of 10000 hours.

For purposes of comparison, a conventional MBE method was employed in growing the single crystal Al and forming the Al film. No single crystal Al was grown.

Embodiment 25

Figure 25:
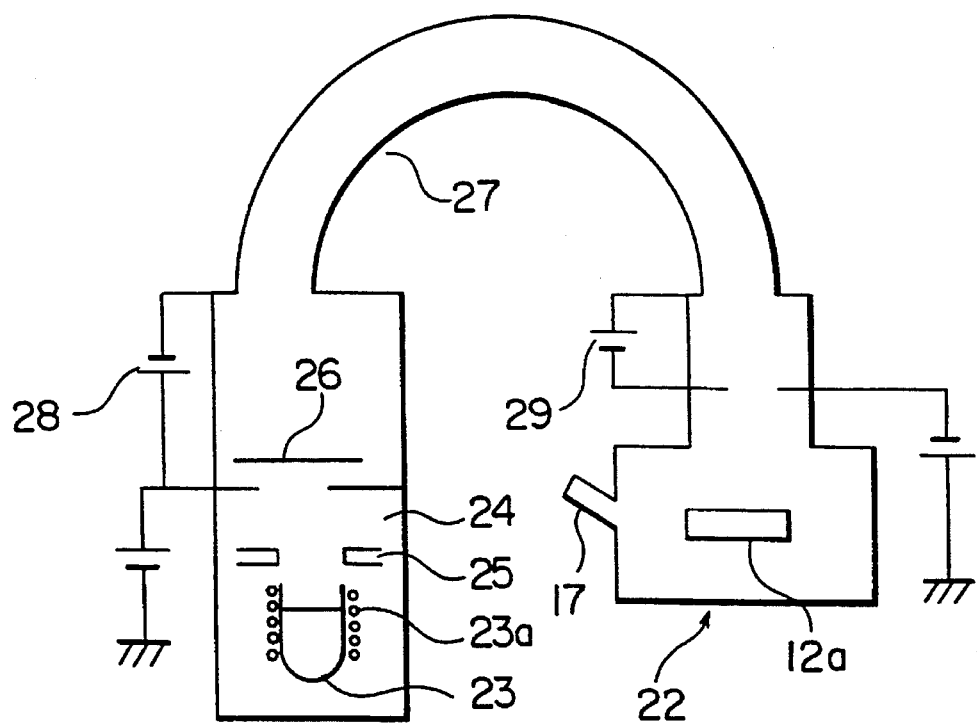
Figure 26A:
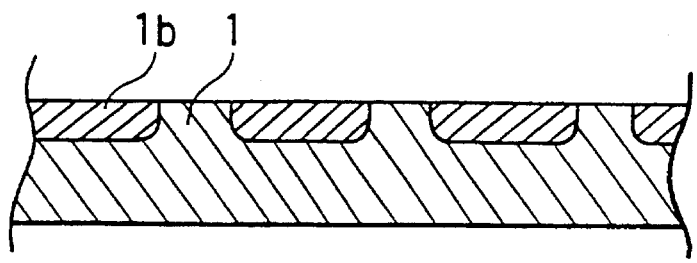
FIG. 26 (a) to (e), FIG. 30 (a) to (d), and FIG. 31 (a) to (f) are sectional views each schematically showing the manufacturing process steps according to the present invention.
Figure 26B:
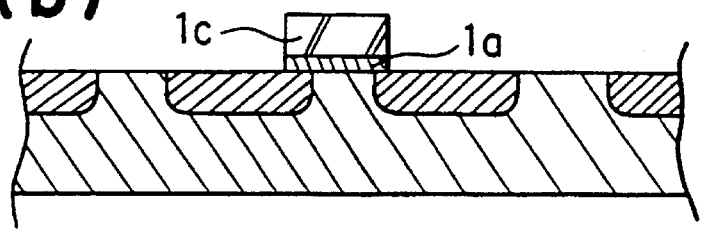
Figure 26C:
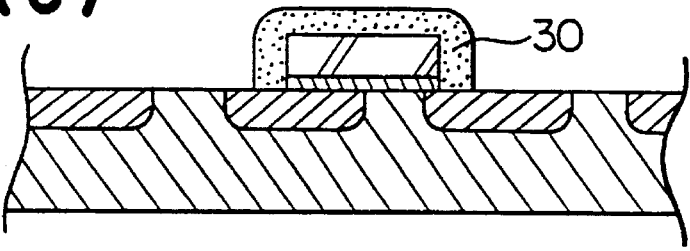
Figure 26D:
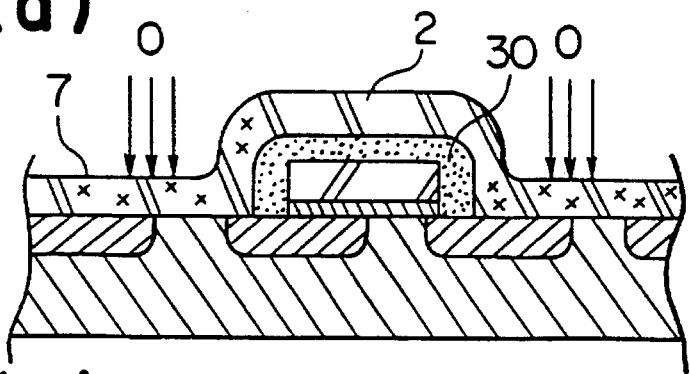
Figure 26E:
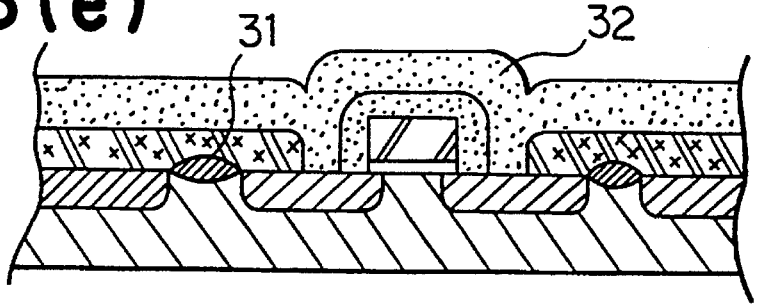
Figure 27A:
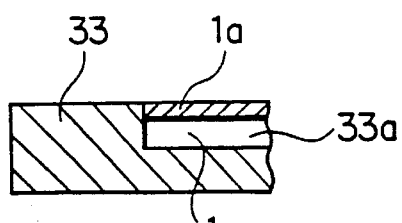
FIGS. 27 and 28 are sectional views each showing an example of the arrangement of a supporting body or cover of the semiconductor substrate used in forming an electrode line thin film in the method of manufacturing a semiconductor device according to the present invention.
Figure 27B:
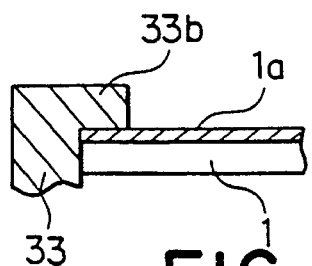
Figure 27C:
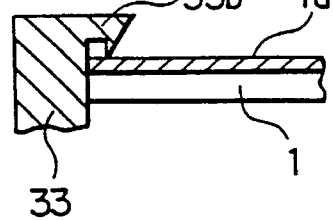
Figure 27D:
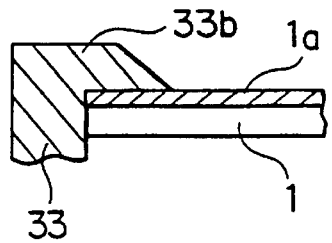
Figure 27E:
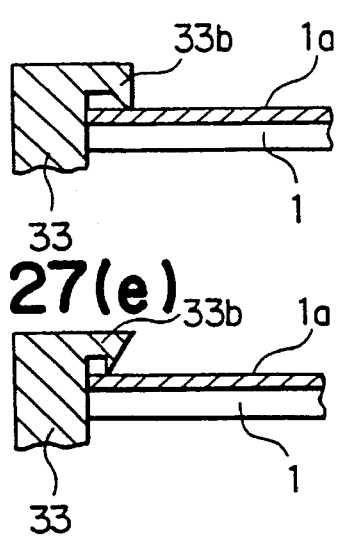

A silicon substrate having active regions and a 5000 Å thick amorphous oxide layer formed thereon was prepared, and this silicon substrate was placed on a substrate holder 12a within a vacuum vessel 22 of a thin film forming apparatus whose main portion is shown cross-sectionally in FIG. 25. After the vacuum vessel 22 was evacuated to $1 \times 10^{-10}$ Torr, the surface of the silicon substrate was heated to 1000° C. and cleaned.

Thereafter, the temperature of the silicon substrate was set to 250° C., a temperature for forming a thin film. While Al was evaporated from an MBE evaporation source 23 having a heater 23a, an electric discharge chamber 24 was evacuated to about $1 \times 10^{-5}$ Torr and voltage was applied to an electric discharge electrode 25 thereby to start electric discharge to dissolve the evaporated Al in a monatomic form. Then, by opening a shutter 26, the Al vapor dissolved in a monatomic form was caused to pass through a mass spectrograph 27; only a single atom having a single energy was separated; and the separated single atom was deposited on the silicon substrate. The electric discharge conditions were: a discharge gap voltage of 1 kV and a discharge current of 400 mA. In FIG. 25, reference numeral 28 designates a power supply for acceleration electrode, and 29, a power supply for deceleration electrode.

The Al film to be thus formed was deposited at a growth speed of 10 μm/h with a high energy reflection electron diffractometer 17 while observing its crystallinity on the spot. The Al film thus formed was subjected to transmission electron microscopy, the result of which was a satisfactory single crystal film having no voids. The surface of the Al single crystal film which was in contact with the amorphous oxide layer formed the close-packed plane.

The single crystal Al film thus formed was processed into an electrode line of 0.5 μm in width and 1 m in length as shown in FIG. 1 and arranged so that the close-packed plane could be parallel to the longitudinal direction of the line. Thereafter, a 5000 Å thick PSG layer and a 7500 Å thick plasma SiN layer were sequentially formed on the electrode line formed surface, which was then subjected to a high temperature test at 150° C. The electrode line thus formed exhibited no line failure even after the elapse of 10000 hours.

For purposes of comparison, a conventional MBE method was employed in growing the single crystal Al and forming the Al film. No single crystal Al was grown.

In the case of a semiconductor device prepared under the same conditions as those of embodiment 24 using the apparatus as shown in FIG. 25, an effect similar to that in the present embodiment was obtained.

Embodiment 26

As shown in FIG. 26 (a), a part other than that for forming a predetermined active region 1b on a P-type silicon substrate 1 was masked, and then was doped with As in quantities of about $10^{17}/cm^2$ thereby to form an active region 1b for drain. Then, as shown in FIG. 26 (b), an about 200 Å thick gate oxide film 1a was formed on the silicon substrate 1 by thermal oxidation, on which a polycrystalline silicon film was deposited about 4000 Å thick as a gate electrode 1c by a CVD method, which was then processed into a gate electrode 1c by photolithography.

A SiO₂ film was deposited 8000 Å on the gate electrode 1c thus formed and the silicon substrate 1 by an atmospheric pressure CVD method as shown in FIG. 26 (c) thereby to form a passivation film 30, and then this passivation film 30 formed on the region other than the gate electrode 1c removed by photolithography.

Then, as shown in FIG. 26 (d), a 4000 Å thick Al film 2 was formed on the silicon substrate 1 by a TIBA-based thermal CVD method by adjusting the substrate temperature to 430° C. and the gas temperature to 250° C. When the Al film 2 thus formed was identified by an X-ray based Laue method, a single crystal was formed on the silicon substrate 1.

Thereafter, oxygen ions accelerated through the single crystal Al film 2 were implanted into the region other than each active region 1b on the silicon substrate 1 in quantities of about $10^{21}/cm^2$. The silicon substrate was then subjected to a thermal treatment to oxidize the ion implanted part and to recover the crystallinity of the Al film 2 whose orientation was impaired by ion implantation. Thus, as shown in FIG. 26 (e), an insulating layer 31 composed of a mixture of Al₂O₃ and SiO₂ adjacent to the interface between the single crystal Al film 2 and the silicon substrate 1 was formed.

After separating each active region 1b by the mixed insulating layer 31, the single crystal Al film 2 formed on the gate electrode 1c was removed by photolithography, and the single crystal Al film 2 on the silicon substrate 1 was processed into an electrode line. Then, boron and phosphorus-doped silicate glass was deposited by the atmospheric pressure CVD method to form an interlayer insulating film and a passivation film 32 thereby to prepare a semiconductor device.

When the semiconductor device thus formed was subjected to a high temperature test at 150° C., the electrode line exhibited no line failure at all even after the elapse of 3000 hours. Thus, it was proven that the single crystal Al line film has an excellent endurance against stress induced failure.

For purposes of comparison, an Al film was formed first by forming the SiO₂ insulating layer 31 for separating each active region 1b by the CVD method and then by growing the Al film by the thermal CVD method thereon. In this case, it was impossible to obtain single crystal Al; and only polycrystalline Al did grow. Another semiconductor device in which the formed Al film was processed into an electrode line in an arrangement similar to the above exhibited a number of voids including Al film electrode line failure in a 150° C. high temperature test.

In this embodiment, after the predetermined gate electrode was arranged and the insulating film was formed on the gate electrode and the like, the Al film and the like were grown by the thermal CVD method on the silicon substrate having the insulating film and the active regions around the insulating film before the SiO$_2$ insulating layer for separating the active regions was formed. Since the semiconductor substrate such as a silicon substrate is of cubic structure, the single crystal Al film, being of a similar crystal system, can be formed easily and accurately and thus serves as an Al line with an excellent endurance against stress induced failure.

Embodiment 27

This embodiment relates also to a method of manufacturing a semiconductor device, and more particularly to forming a single crystal electrode line. In order to form a single crystal electrode line on a line forming surface of a semiconductor substrate, the process of growing a metal single crystal film involves the process of causing a single crystal made member to come in contact with the line forming surface of the semiconductor substrate and of causing a single crystal material to be deposited thereon so as to be in contact with such a member, and the subsequent process of growing the deposited single crystal material from the side where the material is in contact with the member.

In forming this embodiment, it is necessary as described above that the single crystal made member be caused to come in contact with the line forming surface of the semiconductor substrate, and a suitable single crystal made member includes a supporting body for supporting the semiconductor substrate or a cover having a through hole or a window arranged on the semiconductor substrate.

FIGS. 27 (a) to (e) show examples of the structure of the supporting body for supporting the semiconductor substrate. A metal single crystal supporting body 33 in FIG. 27 (a) has a recess part 33, on its upper surface, for inserting the semiconductor substrate 1 thereinto, and the semiconductor substrate 1 having an amorphous insulating layer 1a arranged thereon is inserted into this recess part 33a. The metal single crystal supporting body 33 in FIGS. 27 (b) to (e) has a retainer 33b arranged so as to project from its periphery and to be inserted to the semiconductor substrate 1 having the amorphous insulating layer formed on the surface.

Figure 28:
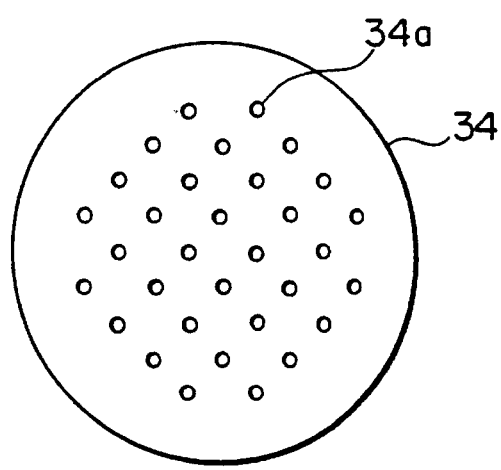
Figure 29:
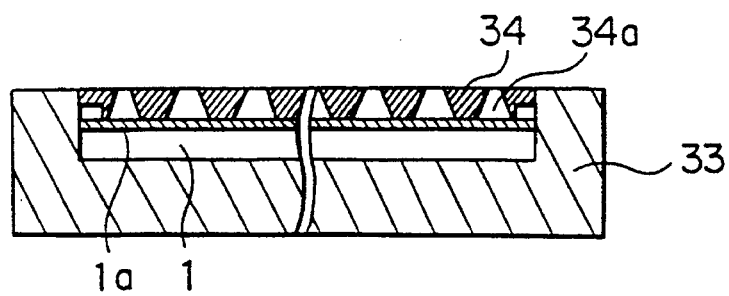
FIG. 29 is a schematic showing the manufacturing mode of an electrode line single crystal film in the method of manufacturing a semiconductor device according to the present invention.
Figure 30A:
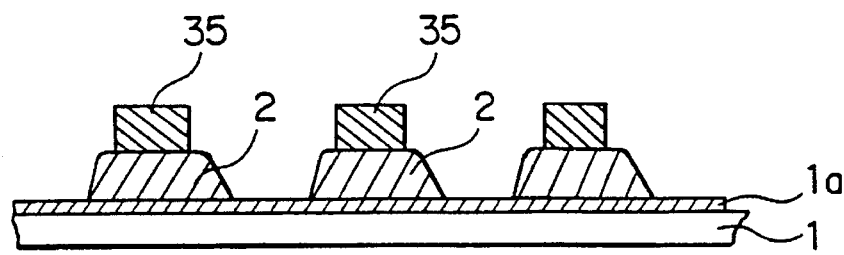
Figure 30B:
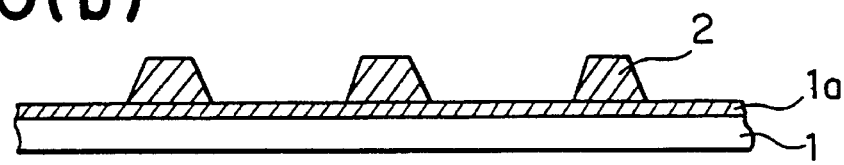
Figure 30C:
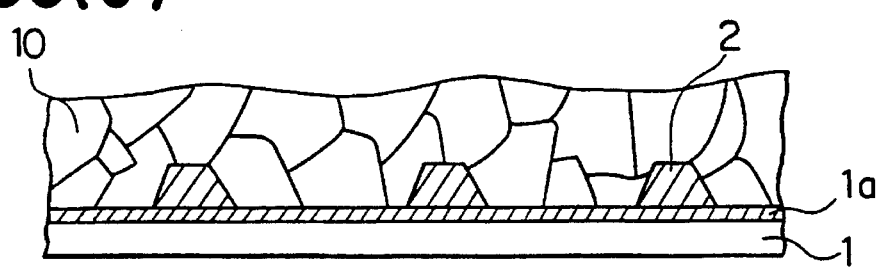
Figure 30D:
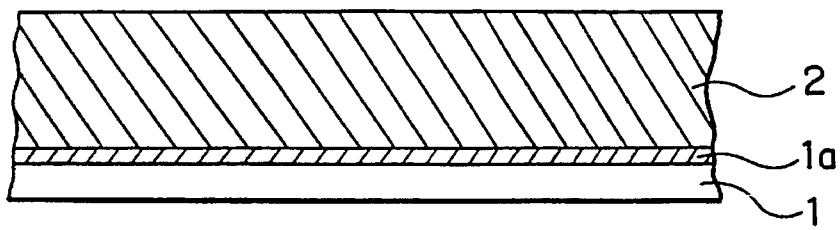
Figure 31A:
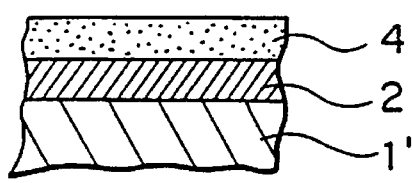
Figure 31B:
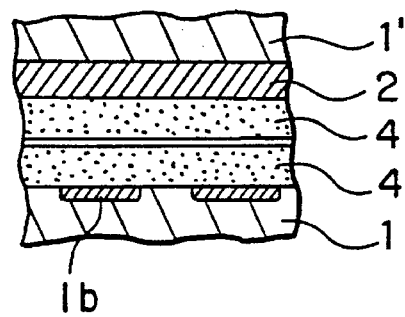
Figure 31C:
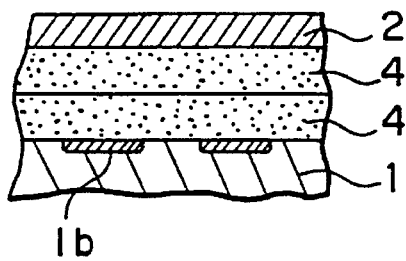
Figure 31D:
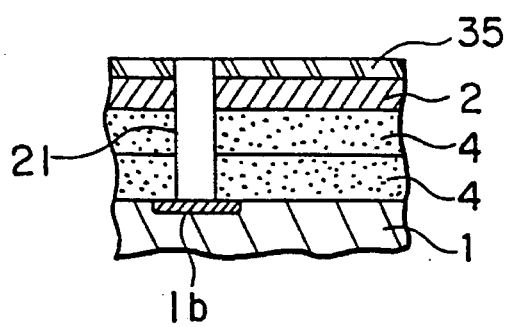
Figure 31E:
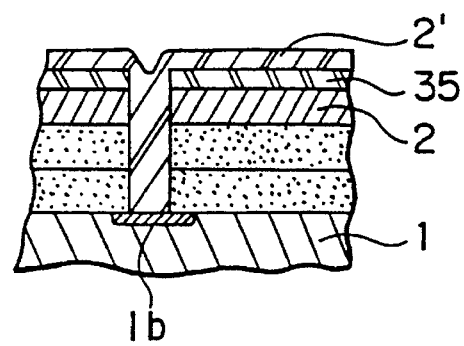
Figure 31F:
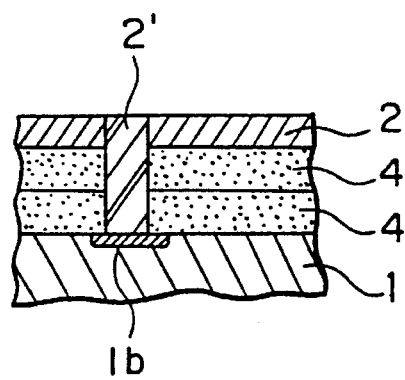

Using such a supporting body, a single crystal material is deposited on the surface of the semiconductor substrate by, e.g., a thermal CVD method, sputtering, or vacuum evaporation. As a result, a part of the grown film is formed also on the supporting body, from which the crystal develops and extends to a grown film on the insulating layer of the semiconductor substrate thereby to form a single crystal over the entire surface. Therefore, if the grown film at the interface between the supporting body and the semiconductor substrate is cut by, e.g., a laser beam after a predetermined film has been formed, a semiconductor substrate having a single crystal conductive metal thin film formed thereon can be obtained. FIGS. 28 and 29 show examples of a single crystal cover 34 having a plurality of through holes or windows 34a arranged on the surface of the semiconductor substrate. The through holes or windows 34a are formed into an inverted cone so that the cover can be separated from the semiconductor substrate after the single crystal material has been deposited.

When such a cover is used, a single crystal film is formed island-like on the surface of the semiconductor substrate. Thus, by removing the cover thereafter and depositing thereon the single crystal material by, e.g., a thermal CVD method, sputtering, or vacuum evaporation, and subjecting the substrate thus processed to a thermal treatment, a predetermined single crystal film can be grown on the insulating layer of the semiconductor substrate.

More specific examples will now be described with reference to FIGS. 30 (a) to (d).

A silicon substrate having active regions and an about 5000 Å thick SiO$_2$ film formed thereon was prepared, and an Al single crystal cover (thickness: 1 mm; through hole diameter: 1 mm; through hole interval: 3 mm) whose structure is as shown in FIGS. 28 and 29 were covered thereon. Then, a 1000 Å thick Al film 2 was deposited island-like on the silicon substrate 1 by a TIBA-based thermal CVD with a substrate temperature of 430° C. and a gas temperature of 250° C., and then subjected to a thermal treatment at 500° C. for 30 min. By this thermal treatment a single crystal grew within the Al film deposited on the part which was in contact with the cover.

Then, a resist layer 35 was arranged by a photoetching process as shown in FIG. 30 (a); subjected to an etching process thereby to form an island-like Al single crystal film 2 as shown in FIG. 30 (b). Thereafter, an oxide on the surface of the island-like Al single crystal film was removed by a sputtering etching process. Then, a 7000 Å thick non-single crystal Al film 10 was formed (FIG. 30 (c)) on the silicon substrate 1 heated to 430° C. again by the TIBA-based thermal CVD method with a gas temperature of 250° C. and then was subjected to a thermal treatment at 500° C. for 30 min. By this thermal treatment a single crystal was nucleated from the single crystal Al film and a single crystal Al film extended over the entire surface of the oxide layer 1a of the silicon substrate 1 as shown in FIG. 30 (d). The single crystal Al film 2 has an excellent orientation and had no grain boundary. After the single crystal Al film 2 on the silicon substrate 1 was processed into an electrode line, buron and phosphorus-doped silicate glass was deposited on the electrode line and the like by an atmospheric pressure CVD method, and an interlayer insulating film and a passivation film were formed to prepare a semiconductor device.

The semiconductor device thus formed was subjected to a high temperature test at 150° C., and exhibited no line failure at all even after the elapse of 3000 hours. Thus, it was verified that the single crystal Al line film has an excellent endurance against stress induced failure and the like.

In the foregoing, a similar effect was obtained when an amorphous layer such as P-doped SiO$_2$, buron and phosphorus-doped SiO$_2$, or plasma SiN was employed in lieu of SiO$_2$ as an insulating layer on the silicon substrate.

Embodiment 28

As shown in FIG. 31 (a), a 4000 thick single crystal Al film 2 and further a 5000 Å thick PSG film 4 were sequentially deposited on a (111) silicon substrate 1' heated to 430° C. by a TIBA-based thermal CVD method with a gas temperature of 250° C. On the other hand, as shown in FIG. 31 (b), a silicon substrate 1 having the 5000 Å thick PSG film 4 formed on the surface on which a predetermined active region 1b was arranged was prepared. These silicon substrates 1 and 1' were bonded through an epoxy resin adhesive agent so that the PSG films 4 and 4 contact with each other, and then Jointed by fusion at a temperature lower than the melting point of Al.

Then, the silicon substrate 1' having the single crystal Al film 2 deposited thereon was subjected to a lapping process to cut the silicon substrate 1' and then to a chemical etching to completely remove the silicon substrate 1' (FIG. 31 (c)). Thereafter, as shown in FIG. 31 (d), a resist layer 35 was formed on the exposed Al single crystal film 2 surface, and a contact hole 21 corresponding to the active region 1b on the silicon substrate 1 was arranged by a reactive ion etching process (FIG. 31 (d)).

With the contact hole 21 opened, Al2' was arranged to fill the contact hole 21 by a thermal CVD method (FIG. 31 (e)), taking advantage of the difference in growth speed between the resist layer 35 and the active region 1b of the silicon substrate 1. Then, the resist layer 35 was removed by a reactive ion etching process and the Al single crystal film 2 exposed by reactive ion etching was processed into a 1 μm wide electrode line (FIG. 31 (f)).

After the single crystal Al film 2 was processed into the electrode line, a PSG glass film and further a SiN film were sequentially deposited 5000 Å and 7500 Å thick, respectively, on the electrode line formed surface by an atmospheric pressure CVD method thereby to prepare a semiconductor device.

The semiconductor device thus formed was subjected to a high temperature test at 150° C., and exhibited no line failure at all even after the elapse of 3000 hours. Thus, it was verified that the single crystal Al line film has an excellent endurance against stress induced failure and the like.

The present embodiment was achieved by arranging a metal single crystal film constituting the electrode line on the surface of a supporting substrate so as to transfer, taking advantage of the fusing characteristic of an insulating layer with a relatively low melting point formed on the metal single crystal film surface.

Embodiment 29

The present embodiment also relates to the formation of an electrode line and its main feature is that: the surface of a semiconductor substrate is treated by ozone or oxygen plasma; a monatomic layer composed of a film forming material is formed on the treated surface as an underlayer; and the film forming material is deposited on the monatomic layer by a CVD method.

Figure 32:
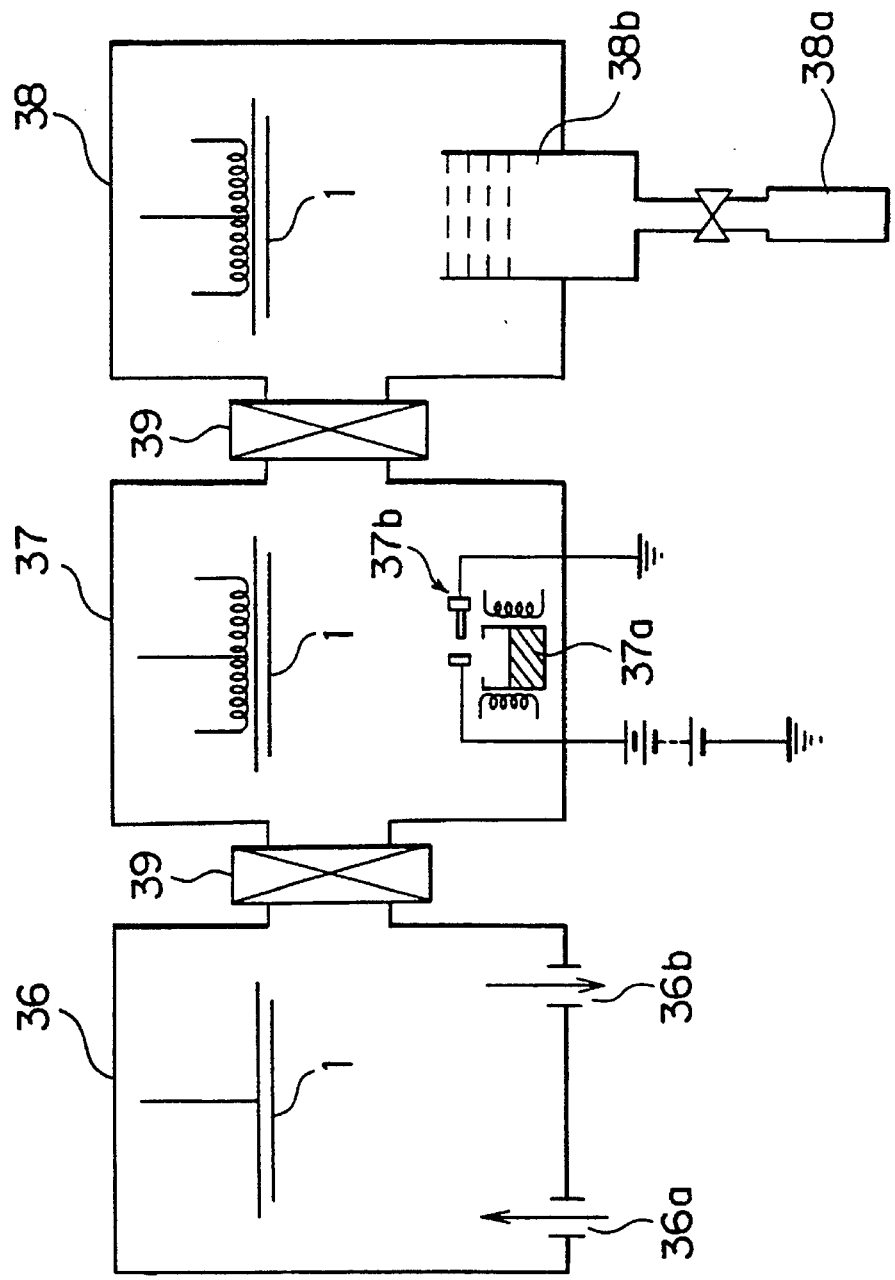

First, a single crystal thin film forming apparatus whose schematic structure is cross-sectionally shown in FIG. 32 was prepared. This apparatus comprises a surface treatment chamber 36, an atomic beam epitaxy (ABE) chamber 37, and a CVD chamber 38, which chambers 36, 37, 38 are partitioned by gate valves 39, and allows a semiconductor substrate 1 for treatment to be transported between the chambers 36, 37, 38 and between the chamber and the outside.

The surface treatment chamber 36 includes a gas supply inlet 36a for supplying an ozone gas and the like and a gas exhaust outlet 36b. The ABE chamber 37 has an evaporation source 37a and a single atom discharge electrode 37b. The CVD chamber 38 is of ordinary construction.

A silicon substrate 1 having active regions and a 3000 Å thick amorphous oxide layer ($SiO_2$) on the surface thereof was prepared, and was exposed to an ozone ambient within the surface treatment chamber 36 for 10 min. By this treatment the dangling bond that was terminated by the hydrogen atom of the $SiO_2$ film was cut to be replaced by an oxygen atom and to remove the hydrogen atom in the form of $H_2O$.

Then, the silicon substrate 1 thus surface-treated was transported into the ABE chamber 37 through the gate valve 39. After the ABE chamber 37 was evacuated to $5 \times 10^{-10}$ Torr, the silicon substrate 1 was heated to 400° C. and Al was evaporated and deposited on the silicon substrate 1 in quantities equivalent to a monatomic layer from the ABE cell.

Subsequent to the deposition of the monatomic layer, the silicon substrate 1 thus processed was transported into the Al-CVD chamber 38 through the gate valve 39, and an Al film was deposited almost 4000 Å on the silicon substrate 1 that was heated to 450° C. by a TIBA-based thermal CVD method with a gas temperature of 250° C. The TIBA in the formation of the Al film was supplied from a tank 38a, gasified by bubbling, and introduced to the surface of the silicon substrate in the form of molecular flow, while controlling its temperature by a heating cell 38b.

The Al film (layer) deposited on the silicon substrate 1 was subjected to reflection electron diffractometry and transmission electron microscopy of its crystal orientation. As a result, a single crystal film had an excellent (111) orientation and no grain boundary was observed.

The single crystal Al film, after being processed into an electrode line and having a PSG glass film and then a SiN film deposited 5000 Å and 7500 Å thick, respectively, on the electrode line formed surface by the atmospheric pressure CVD method, was subjected to a high temperature test at 150° C. As a result, there was no line failure on the electrode line even after the elapse of 3000 hours, and it was verified that the single crystal Al line film has an excellent endurance against stress induced failure and the like.

In the present embodiment, the metal single crystal film constituting the electrode line was composed of Al. However, when Al was replaced by Cu, the similar results were obtained. The similar results were also obtained when the single crystal film was formed by a cluster ion beam (ICB) evaporation method, in which a cluster of $10^2$ to $10^4$ atoms is produced, ionized, and then formed into a monatomic layer on the surface of the silicon substrate by accelerated evaporation. (Blank)

Embodiment 30

Figure 33:
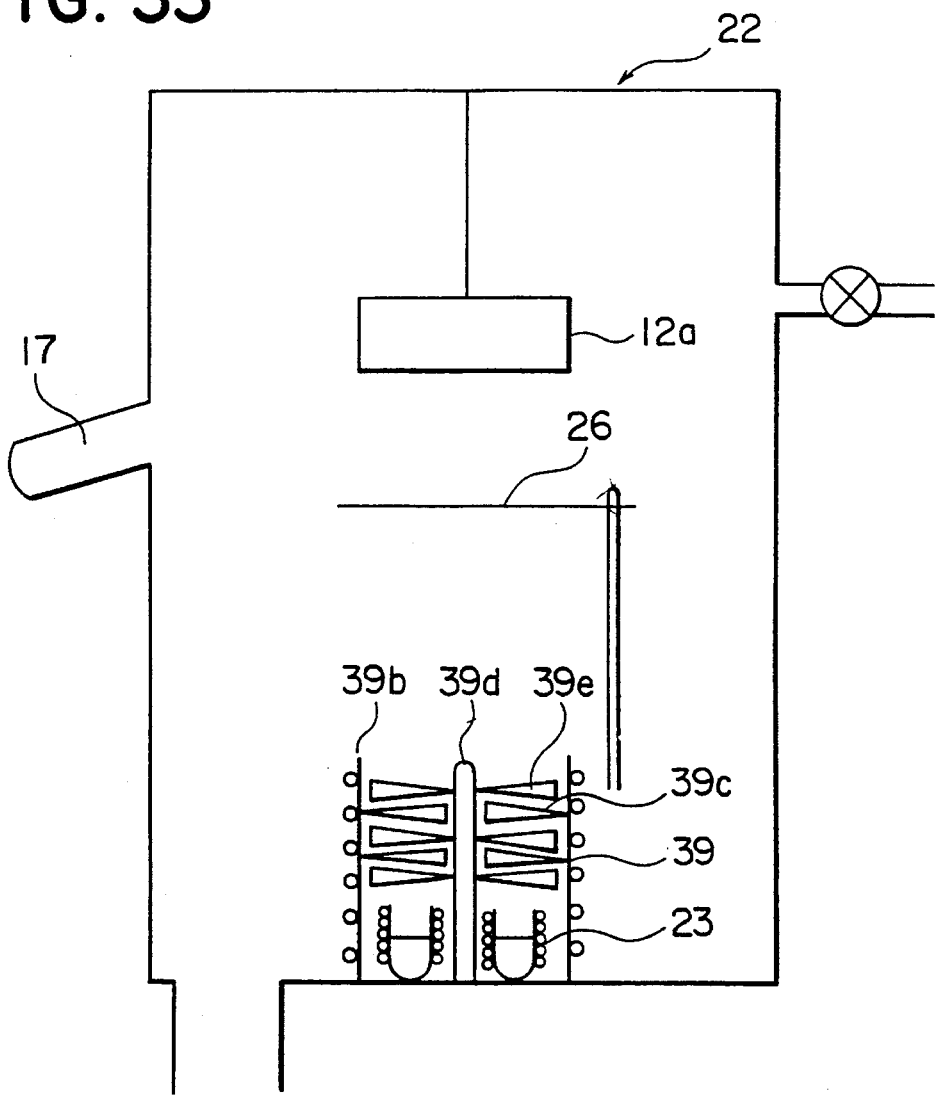

First, a thin film forming apparatus, the schematic structure of which is cross-sectionally shown in FIG. 33, was prepared. The main portion of this apparatus comprises a vacuum vessel 22, a substrate holder 12a disposed in an upper portion of the vacuum vessel 22, an MBE evaporation source 23 arranged in a lower portion of the substrate holder 12a, a cracker 39 arranged between the MBE evaporation source 23 and the substrate holder 12a, and a shutter 26.

Figure 34:
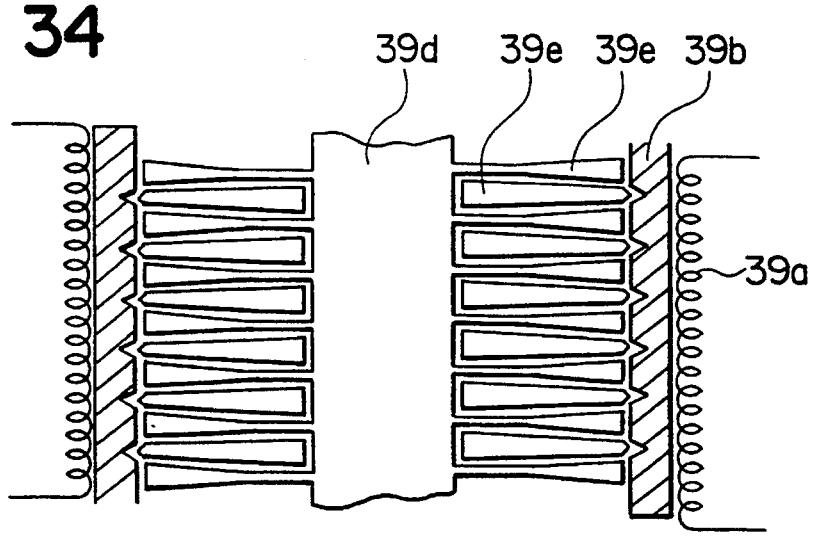
Figure 35:
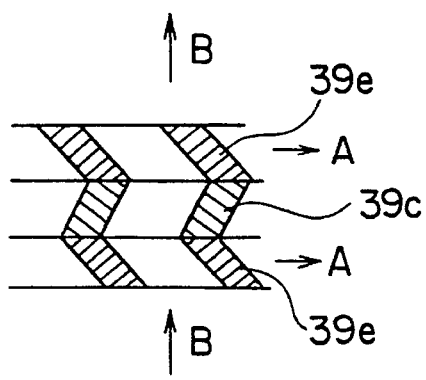

The cracker 39 includes, as shown in FIG. 34 in enlarged form, a cylindrical turbine chamber 39b having a heater 39a, a fixed multistage impellers 39c arranged within the turbine chamber 39b so as to be orthogonal to the axial line of the turbine chamber 39b, a rotary impeller 39e which is rotated at high speeds by a motor arranged radially on a rotary shaft 39d and between the fixed impellers 39c, and the like. Thus, as shown in FIG. 35, the sectional profiles of the fixed impeller 39c and rotary impeller 39e are inclined so as to be contrary to each other. For this reason, as the probability that an evaporated gas will be dissolved into atoms is increased and if, e.g., the rotary impeller 39e is rotated in a circumferential direction such as shown by the arrow A, a sucking force in a direction of the arrow B is generated by pump action, thereby causing a flow of the atoms of a film forming substance from the evaporation source 23 to the substrate holder 12a.

In the present embodiment, an amorphous oxide film formed 5000 Å thick on a silicon substrate (single crystal) having a predetermined active region on the surface thereof was placed on the substrate holder 12a within the vacuum vessel 22 of the above-described apparatus, and then the vacuum vessel 22 was evacuated to $1\times10^{-10}$ Torr. Then, the silicon substrate was heated to 1000° C. and cleaned, and thereafter ozones were introduced into the vacuum vessel so that the pressure therein would be about $1\times10^{-8}$ Torr, and hydrogen adsorbed on the surface of the silicon substrate was replaced by oxygen. Thereafter, the silicon substrate was heated to 250° C.; Al was evaporated by the MBE evaporation source 23; and the turbine chamber 39b was evacuated to about $1\times10^{-7}$ Torr, while the surface temperature of the fixed impeller 39c and rotary shaft 39d was maintained at 700° C. which is higher than the melting point of Al. Then, after the rotary impeller 39e was activated to rotate so that its circumferential speed was 10000 rpm, which is a thermal velocity, the shutter 26 immediately below the silicon substrate was opened and a film forming was started while giving a mechanical energy to the evaporated Al from the evaporation source 23 by the cracker 39.

The formation process was performed while observing the crystallinity of Al being formed with the high energy reflection electron diffractometer 17 on the spot. The first 10 atomic layers were formed while checking the growth layer by layer; thereafter, it was arranged so that the formation process could proceed at a film forming speed of 1 to 10 μm/h as in the case of forming the single crystal substrate. When the Al film thus produced was subjected to transmission electron microscopy, it was indicated that the single crystal Al film had no void at all.

The single crystal Al film was processed into an electrode line of 0.5 μm in width and 1 m in length as shown in FIG. 1 and arranged so that the (111) plane could be parallel to the longitudinal direction of the line. Thereafter, a 5000 Å thick PSG glass layer and then a 7500 Å thick plasma SiN layer were sequentially deposited on the electrode line formed surface, which was then subjected to a high temperature test at 150° C. As a result, there was no line failure at all even after the elapse of 1000 hours.

Embodiment 31

A Si substrate having active regions and a thin $SiO_2$ film arranged thereon was prepared. Then, a stepped pattern and thin film forming apparatus, whose main construction is cross-sectionally shown in FIG. 12, was prepared.

The Si substrate 1 was held on an electrostatically bonding substrate holder 12 arranged within the stepped pattern and thin film forming apparatus 11. While the stepped pattern and thin film forming apparatus 11 was evacuated to $10^{-10}$ Torr and TIBA was adsorbed in monomolecular form by the surface of the Si substrate 1 held on the electrostatically adsorbing substrate holder 12. Thereafter, TIBA was dissolved by irradiating an electron beam 14, whose beam diameter was converged to several angstroms, onto the surface of the Si substrate 1 and a terrace of Juxtaposed Al stripes of 3 Å in width and 8 Å in repetitive cycle was formed while controlling the scanning direction by a deflection coil 15.

Then, from a K-cell 16 arranged within the stepped pattern and thin film forming apparatus, Al was deposited on the surface of the Si substrate 1 in 10 atomic layers. After verifying that each of these layers was of single crystal by a reflection electronic diffractometer 17, the silicon substrate thus processed was transported into a CVD apparatus (not shown). The stepped pattern and thin film forming apparatus, and the CVD apparatus were connected with each other through a gate valve.

A (100) oriented single crystal Al film was formed 4000 Å thick on the Si substrate 1 accommodated within the CVD apparatus by a TIBA-based thermal CVD method. The underlayer temperature in this case was 430° C. and the film growth speed was 8000 Å/min. When the orientation relationship of the single crystal Al film thus formed with the substrate was identified by diffractometry, a single crystal was observed. Also, no grain boundary nor any crystalline voids such as lamination voids were found by transmission electron microscopy.

The single crystal Al film thus formed by the thermal CVD method was processed into an electrode line of 0.5 μm in width and 1 m in length as shown in FIG. 1 and arranged so that the (111) plane could be parallel to the longitudinal direction of the line. Thereafter, a 5000 Å thick PSG layer and a 7500 Å thick plasma SiN layer were sequentially formed on the electrode line formed surface, which was then subjected to a high temperature test at 150° C. As a result, no line failure occurred even after the elapse of 10000 hours.

Embodiment 32

A Si substrate having active regions and a thin $SiO_2$ film arranged thereon was prepared. Then, a stepped pattern and thin film forming apparatus, whose main construction is cross-sectionally shown in FIG. 12, was prepared.

The Si substrate 1 was held on an electrostatically bonding substrate holder 12 arranged within the stepped pattern and thin film forming apparatus 11. While the stepped pattern and thin film forming apparatus 11 was evacuated to $10^{-10}$ Torr and monosilane ($SiH_4$) was adsorbed in monomolecular form by the surface of the Si substrate 1 held on the electrostatically adsorbing substrate holder 12. Thereafter, monosilane was dissolved by irradiating an ion beam 14a, whose diameter was converged to 5000 Å, onto the surface of the Si substrate 1 and a terrace of Juxtaposed Al stripes of 5000 Å in width and 2 μm in repetitive cycle was formed while controlling the scanning direction by a deflection coil 15.

Then, from a K-cell 16 arranged within the stepped pattern and thin film forming apparatus, Al was deposited on the surface of the Si substrate 1 in 10 atomic layers. After verifying that each of these layers was of single crystal by a reflection electronic diffractometer 17, the silicon substrate thus processed was transported into a CVD apparatus (not shown). The stepped pattern and thin film forming apparatus, and the CVD apparatus were connected with each other through a gate valve.

A (100) oriented single crystal Al film was formed 4000 Å thick on the Si substrate 1 accommodated within the CVD apparatus by a monosilane-based thermal CVD method. The underlayer temperature in this case was 360° C. and the film growth speed was 500 Å/min. Since voids were present in the single crystal Si film immediately after lamination, the single crystal Si film was subjected to a thermal treatment at 900° C. for 30 min within the CVD apparatus. Then, the orientation relationship of the single crystal Al film thus formed with the substrate was identified by diffractometry. As a result, a single crystal was observed. Also, no grain boundary nor any crystalline voids such as lamination voids were found by transmission electron microscopy.

As is apparent from embodiments 31 and 32, when forming a single crystal film for electrode line by interposing a thin oxide layer on the surface of a semiconductor substrate such as a silicon substrate, a monomolecular layer containing a film forming atom is adsorbed to form a step or a terrace that serves as a nucleus of a crystal, and this monomolecular layer is dissolved to form a monatomic layer. Through the above process a satisfactory single crystal layer having a predetermined crystal orientation can be obtained. Thus, the monomolecular layer can be dissolved not only by an electron beam or an ion beam but also by irradiating electromagnetic waves such as X rays and ultraviolet rays.

Further, when a straight step is used as a place for nucleation, a crystal grows into a pattern so that the most-closely packed surface is parallel to the surface of the semiconductor substrate. When a pattern involving two steps being orthogonal to each other, a crystal grows so that the grown surface is (100) oriented. In order to obtain a crystal plane of higher dimension, a pattern which is geometrically analogous to the lattice space of such a crystal plane may be used. Furthermore, in the case where a single crystal thin film is to be grown on the entire surface of a relatively extensive semiconductor substrate, a cyclic pattern which is geometrically analogous to the lattice space of the crystal plane may be used.

Embodiment 33

A Si substrate having active regions and an about 8000 Å thick $SiO_2$ film formed thereon was prepared. A charging potential was cyclically given onto the $SiO_2$ film of the Si substrate by irradiating an electron beam at an accelerated voltage of 20 kV. Thereafter, an about 4000 Å thick Al film was deposited thereon by a dc magnetron sputtering method. The sputtering conditions were: a power output of 500 W, a vacuum degree of $1\times10^{-3}$ Torr, and a sputtering time of 30 sec.

The above deposited Al film was subjected to X-ray diffractometry to identify the crystal orientation of the Al film thus deposited. As a result, the Al film was oriented so that its <111> plane was vertical with the surface of the substrate, and its full width at maximum of the (111) diffracted line measured by a θ scanning method was 1 to 2°. For purposes of comparison, an Al film was grown on the $SiO_2$ film without irradiating the electron beam (no cyclic charging potential was given) and its full width at maximum of the (111) diffracted line was measured. The result was 6° to 8°.

Figure 36:
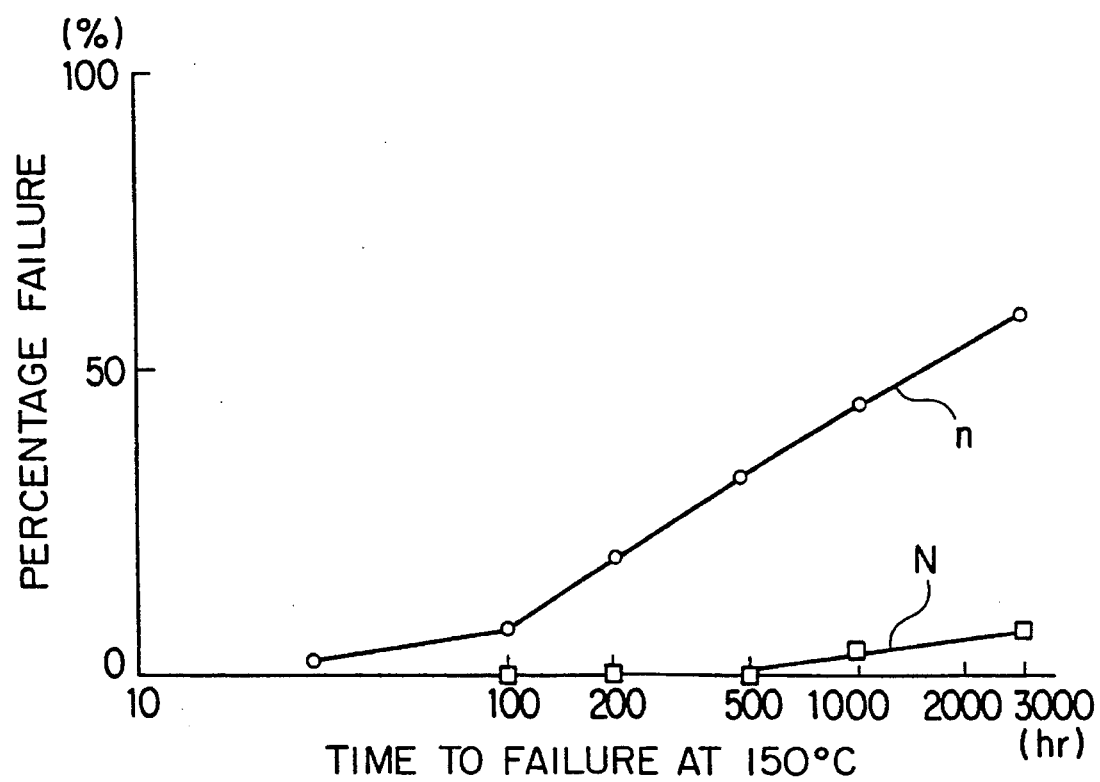

The single crystal Al film thus formed was processed into an electrode line of 1.0, 0.6, or 0.4 μm in width and 1 m in length as shown in FIG. 1. After a 5000 Å thick PSG layer was deposited, the electrode line formed surface was subjected to a high temperature test at 150° C., the results of which are shown in FIG. 36. In the figure, curve N indicates the characteristic of the present embodiment, while curve n indicates the characteristic of the comparative example. As is apparent from the figure, the present embodiment exhibited an excellent endurance against stress induced failure.

When an electrode line whose width is set to 3.3 μm was subjected to an electromigration test with a current density of $5\times10^6$ A/cm² at 200° C., its resistance was increased. It is assumed from such a result that the life of the electrode line would be about 10 times as long as that of the conventional Al electrode line.

In the present embodiment, the similar result was obtained when the above-described electrode line was replaced by a contact layer, which was formed by arranging a contact hole on the 8000 Å thick $SiO_2$ film formed on the Si substrate, then giving a charging potential to the $SiO_2$ film by irradiating an electron beam in the manner similar to the above thereby to cause Al to grow to fill the contact hole.

In the case of the present embodiment, it is possible to form a conductive film with an aligned predetermined crystal orientation by arranging a line forming metal film after giving a charging potential to the insulating layer (film).

Embodiment 34

A (111) oriented single crystal Al film was formed 4000 Å thick on a (111) Si substrate having active regions by a TIBA-based thermal CVD method. Then, oxygen was implanted by ion implantation at an implanting energy of 400 KeV and in quantities of $10^{-19}$ cm$^{-2}$ so that the oxygen could have a peak adjacent to the interface between the Al film and the Si substrate. In this ion implantation, the angle of implantation was set to 8° to prevent channeling.

After the oxygen implantation, the silicon substrate thus processed was subjected to a thermal treatment at 450° C. for 30 min in a vacuum thermal treatment oven. Then, the Al film surface was etched back by sputtering, and Cu, Mg, or Ti was deposited on the etched surface in different quantities by sputtering. After thermally treated at 450° C. for 40 hours in the vacuum thermal treatment oven thereby to homogenize the etched surface, the silicon substrate thus far processed was subjected to a Rutherford back scattering (RBS)-method. As a result, the composition of the Al film was as shown in Table 6.

The RBS analysis detected a channelling, thereby proving that the Al film was of single crystal. Further, it was observed that the implanted oxygen was developed into $Al_2O_3$ and $SiO_2$ at the Al/Si interface.

TABLE 6

| Composition of sample | Line formability | Number of voids per unit length (pcs/cm) |
|---|---|---|
| Al-0.01 at % Cu | ⊚ | 45 |
| Al-0.1 at % Cu | ⊚ | 33 |
| Al-0.5 at % Cu | ○ | 28 |
| Al-1 at % Cu | X | 27 |
| Al-0.01 at % Ti | ⊚ | 63 |
| Al-0.08 at % Ti | ⊚ | 52 |
| Al-0.1 at % Ti | ⊚ | 49 |
| Al-0.2 at % Ti | X | 48 |
| Al-0.05 at % Mg | ⊚ | 50 |
| Al-0.1 at % Mg | ⊚ | 44 |
| Al-0.5 at % Mg | ○ | 42 |
| Al-2 at % Mg | X | 40 |

The Al single crystal alloy film that is isolated from the Si substrate by the above-described oxide film was processed into a 0.5 μm wide and 1 m long electrode line as shown in FIG. 1 and arranged so that the (111) plane was parallel to the longitudinal direction of the line. Then, a 5000 Å thick PSG layer and a 7500 Å thick plasma SiN layer were sequentially formed on the electrode line formed surface thereby to prepare semiconductor devices.

When the semiconductor devices thus formed were subjected to a high temperature test at 150° C. The percent defective was 0% on both semiconductor devices even after the elapse of 10000 hours. Table 6 also indicates the line formability (⊙: excellent, O: satisfactory, X: poor) and the number of voids per unit length (pieces/cm).

In each of the above-described samples, the preferable compositions in terms of formability are:

Al-Cu alloy single crystal: 0.5 at % Cu or less

Al-Ti alloy single crystal: 0.1 at % Ti or less

Al-Mg alloy single crystal: 0.5 at % Mg or less.

Further, a method of preparing a single crystal alloy may be such that a CVD gas is introduced at the time the CVD film is to be formed or may be an ion implantation. In homogenizing the deposited film after thermal treatment, the film may be subjected to an electron beam evaporation process or a resistance heating evaporation process, instead of sputtering.

What is claimed is:

1. A semiconductor device comprising:

a semiconductor substrate having active regions electrically isolated from each other on a predetermined surface thereof, and an electrode line arranged on said semiconductor substrate through an insulator, wherein at least one layer of said electrode line comprises a first electrode line layer and a second electrode line layer, said first electrode layer is made of a metal single crystal layer of a metal selected from the group consisting of Au, Ag, Cu, Al and alloys thereof, and said second electrode line layer is made of a metal polycrystal layer of a metal selected from the group consisting of Au, Ag, Cu, Al and alloys thereof.

2. A semiconductor device according to claim 1, wherein said at least one layer of said electrode line layers is the lowermost electrode line layer of said electrode line layers.

3. A semiconductor device according to claim 1, wherein said at least one layer of said electrode line layers is the uppermost electrode line layer of said electrode line layers.

4. A semiconductor device according to claim 7, wherein said metal single Crystal line comprises an alloy selected from the group consisting of Al-Cu, Al-Ti, Al-Cr, Al-Ta, Al-Mg, Al-In, Al-Li, Cu-Be, Cu-Ag, Au-Pt, Au-Ag, Au-Pd and Au-Cu, an amount of a solute in said alloy being within a range allowing a complete solid solution to be formed.

5. A semiconductor device according to claim 4, wherein said alloy further consists of not more than 1.0% by weight of Si.

6. A semiconductor device according to claim 4, wherein said aluminum alloy is an Al-Ti alloy, said Al-Ti alloy consisting of not more than 0.1 atomic % of Ti.

7. A semiconductor device comprising:

a semiconductor substrate having active regions electrically isolated from each other on a predetermined surface thereof; and a single layer or multilayer electrode line arranged on said semiconductor substrate through an insulating layer;

wherein at least one layer of said electrode line comprises a metal polycrystal consisting of crystal grains, and at least 95% of said crystal grains are arranged so that a normal line direction of at least one closed-packed plane of said crystal grains forms an angle of 80° or less with a normal line direction of the electrode line bottom surface, and said metal polycrystal comprising an alloy selected from the group consisting of Al-Cu, Al-Ti, Al-Cr, Al-Ta, Al-Mg, Al-In, Al-Li, Cu-Be, Cu-Ag, Au-Pt, Au-Ag, Au-Pd and Au-Cu, an amount of addition of a solute in said alloy being within a range allowing a complete solid solution to be formed.

8. A semiconductor device according to claim 7, wherein said alloy further consists of not more than 1.0% by weight of Si.

9. A semiconductor device according to claim 7, wherein said aluminum alloy is an Al-Ti alloy, said Al-Ti alloy consisting of not more than 0.1 atomic % of Ti.

10. A semiconductor device according to claim 4, wherein said alloy is an Al-Cu alloy, said Al-Cu alloy consisting of not more than 0.5 atomic % of Cu.

11. A semiconductor device according to claim 4, wherein said alloy is an Al-Mg alloy, said Al-Mg alloy consisting of not more than 0.5 atomic % of Mg.

12. A semiconductor device according to claim 7, wherein said alloy is an Al-Cu alloy, said Al-Cu alloy consisting of not more than 0.5 atomic % of Cu.

13. A semiconductor device according to claim 7, wherein said alloy is an Al-Mg alloy, said Al-Mg alloy consisting of not more than 0.5 atomic % of Mg.

* * * * *

UNITED STATES PATENT AND TRADEMARK OFFICE
CERTIFICATE OF CORRECTION

PATENT NO. : 5,498,909
DATED : March 12, 1996
INVENTOR(S) : Masahiko HASUNUMA et al.

It is certified that error appears in the above-indentified patent and that said Letters Patent is hereby corrected as shown below:

column 1, line 23, "is made" should be --are made--, and "That are," should be --That is,--;
column 2, line 6, "improving" should be --improve--;
column 8, line 13, "1500 ⌒" should be --1500 Å--;
column 10, line 63, "microns meters." should be --microns.--;
column 14, line 41, "magnetton" should be --magnetron--;
column 20, line 18, "Al/Zr/W/Si)$_2$/Si" should be --Al/Zr/W/SiO$_2$/Si--;
column 24, line 15, "monaromic" should be --monatomic--;
column 28, lines 41 and 52, "buron" should be --boron--;
column 34, line 24, "$10^{-19}$" should be --$10^{19}$--;
column 35, claim 4, "according to claim 7" should be --according to claim 1--.

Signed and Sealed this

Second Day of September, 1997

*Attest:*

BRUCE LEHMAN

*Attesting Officer*     *Commissioner of Patents and Trademarks*